US006967881B2

(12) United States Patent
Sasaki et al.

(10) Patent No.: US 6,967,881 B2
(45) Date of Patent: Nov. 22, 2005

(54) SEMICONDUCTOR INTEGRATED CIRCUIT AND METHOD OF MANUFACTURING OF SEMICONDUCTOR INTEGRATED CIRCUIT

(75) Inventors: Toshio Sasaki, Mizuho (JP); Toshio Yamada, Koganei (JP)

(73) Assignee: Renesas Technology Corp., Tokyo (JP)

( * ) Notice: Subject to any disclaimer, the term of this patent is extended or adjusted under 35 U.S.C. 154(b) by 52 days.

(21) Appl. No.: 10/785,101

(22) Filed: Feb. 25, 2004

(65) Prior Publication Data

US 2004/0165467 A1 Aug. 26, 2004

Related U.S. Application Data

(62) Division of application No. 10/346,097, filed on Jan. 17, 2003, now Pat. No. 6,762,969.

(30) Foreign Application Priority Data

Feb. 7, 2002 (JP) .............................. 2002-030189

(51) Int. Cl.[7] .............................................. G11C 11/00
(52) U.S. Cl. ..................... 365/201; 365/225.7; 365/63; 365/189.03; 365/189.08
(58) Field of Search ....................... 365/201, 63, 225.7, 365/189.03, 189.08

(56) References Cited

U.S. PATENT DOCUMENTS

| | | | | |
|---|---|---|---|---|
| 4,162,536 A | * | 7/1979 | Morley | 714/18 |
| 4,398,248 A | * | 8/1983 | Hsia et al. | 365/230.03 |
| 5,313,424 A | | 5/1994 | Adams et al. | |
| 5,768,290 A | | 6/1998 | Akamatsu | |
| 5,801,986 A | | 9/1998 | Matsumoto et al. | |
| 6,018,559 A | * | 1/2000 | Azegami et al. | 377/79 |
| 6,064,606 A | | 5/2000 | Kuroda et al. | |
| 6,081,911 A | * | 6/2000 | Pascucci | 714/718 |
| 6,246,617 B1 | | 6/2001 | Urakawa | |
| 6,404,224 B1 | * | 6/2002 | Azegami et al. | 326/38 |
| 6,462,995 B2 | | 10/2002 | Urakawa | |
| 6,690,595 B1 | * | 2/2004 | Srinivasan et al. | 365/49 |
| 6,708,319 B2 | * | 3/2004 | Adachi et al. | 716/5 |
| 6,762,969 B2 | * | 7/2004 | Sasaki et al. | 365/225.7 |
| 2002/0015341 A1 | | 2/2002 | Urakawa | |
| 2002/0048191 A1 | | 4/2002 | Ikehashi et al. | |
| 2002/0163840 A1 | | 11/2002 | Hiraki et al. | |

FOREIGN PATENT DOCUMENTS

| | | |
|---|---|---|
| JP | 4-132243 | 9/1990 |
| JP | 2000-315774 | 11/1990 |
| JP | 6-84393 | 1/1993 |

(Continued)

Primary Examiner—Viet Q. Nguyen
(74) Attorney, Agent, or Firm—Reed Smith LLP; Stanley P. Fisher, Esq.; Juan Carlos A. Marquez, Esq.

(57) ABSTRACT

A semiconductor integrated circuit makes use of nonvolatile memory cells of a fuse circuit connected to a dedicated signal line without using a nonvolatile memory intended for general purpose use, which is connected to a common bus, in order to store control information for defect relief and the like of circuit modules. The reliability of storage of the control information is not limited to the performance of storage of information in the nonvolatile memory intended for general purpose use, and the reliability of storage of the control information can be easily enhanced. Since a second wiring used in the transfer of the control information is of a wiring dedicated for its transfer, it needs not perform switching between connections to circuit portions used for actual operations in the circuit modules and their control. A circuit configuration for delivering the control information can be simplified.

17 Claims, 15 Drawing Sheets

FOREIGN PATENT DOCUMENTS

| | | |
|---|---|---|
| JP | 7-12903 | 6/1993 |
| JP | 7-211868 | 1/1994 |
| JP | 8-23016 | 7/1994 |
| JP | 8-208567 | 10/1995 |
| JP | 10-125742 | 10/1996 |
| JP | 409274592 A * | 10/1997 ........... G06F 12/16 |
| JP | 2000-76871 | 9/1998 |
| JP | 2000-149588 | 11/1998 |
| JP | 411044731 A * | 2/1999 ........... G01R 31/28 |
| JP | 2002157894 A | 11/2000 |

* cited by examiner

SEMICONDUCTOR INTEGRATED CIRCUIT AND METHOD OF MANUFACTURING OF SEMICONDUCTOR INTEGRATED CIRCUIT

This application is a Divisional of nonprovisional application Ser. No. 10/346,097 filed Jan. 17, 2003, now U.S. Pat. No. 6,762,969. Priority is claimed based on U.S. application Ser. No. 10/346,097 filed Jan. 17, 2003, which claims the priority of Japanese application 2002-030189 filed on Feb. 7, 2002.

BACKGROUND OF THE INVENTION

The present invention relates to a semiconductor integrated circuit using nonvolatile memory cells to store control information for defect relief, trimming of circuit characteristics or function switching with respect to a plurality of circuit modules, and a method of manufacturing a semiconductor integrated circuit with control information written into such nonvolatile memory cells. The present invention relates to, for example, a technology effective for application to a microcomputer or a system LSI equipped with a logic circuit and a RAM.

A technology for causing a nonvolatile memory cell like a flash memory cell to hold relief information or the like used for defect relief of an on-chip memory and a characteristic adjustment to a logic circuit has been described in Unexamined Patent Publication No. 2000-149588 (corresponding U.S. Pat. No. 2002/163840). According to it, relief information or the like for a defect of a RAM is stored in the flash memory in a semiconductor integrated circuit in which the RAM and the flash memory are implemented on a chip together with a CPU (Central Processing Unit). Further, the relief information or the like held in the flash memory is read into a general-purpose bus as part of an initializing operation at power-on or the like, and the read relief information or the like is loaded into a register inherent in the RAM or the like. The relief information or the like loaded into the register is supplied to a defective address determination circuit, a switching circuit for switching a defective address to a relief address, etc., in the corresponding RAM.

SUMMARY OF THE INVENTION

The present inventors have discussed control information for defect relief, trimming of circuit characteristics or function switching with respect to on-chip circuit modules.

Firstly, high reliability is required of the storage of such control information. When an error occurs in such control information even if only slightly, each circuit module causes a malfunction on a permanent basis or causes an undesired reduction in performance. When a flash memory used on a general-purpose basis upon an actual operation of an LSI is used in the retention of the control information at this time, reliability similar to reliability for general data can be merely obtained for the control information.

Secondly, when control information is initially set using a general-purpose bus, there is a need to provide a switching circuit for changing a configuration of connection of the general-purpose bus used even in an actual operation and each circuit module or a connecting destination in each circuit module, and control logic thereof. Moreover, control on the selection of a register corresponding to a destination to be loaded, addressing and the like is required to load control information into each circuit module by use of a common bus. In brief, a circuit configuration becomes relatively complex.

Thirdly, there is a need to avoid easy rewriting of such control information. Accordingly, address management of a system is also needed in such a manner that rewriting of the control information can be effected on the control information storage region of a flash memory available upon an actual operation in a privileged mode or a user nondisclosure mode alone.

Fourthly, if there is a need to write control information into the flash memory in each case when the confirmation of operation by control information is performed, the frequency of rewriting increases due to the operation confirmation, and hence there is a possibility that characteristic deterioration is incurred in each nonvolatile memory cell.

An object of the present invention is to provide a semiconductor integrated circuit capable of assuring high reliability with respect to control information delivered for defect relief, trimming of circuit characteristics or function switching for a plurality of on-chip circuit modules.

Another object of the present invention is to provide a semiconductor integrated circuit capable of simplifying a circuit configuration necessary for delivery of control information for defect relief, trimming of circuit characteristics or function switching.

A further object of the present invention is to provide a semiconductor integrated circuit which lessens a possibility that a rewrite operation will be undesirably effected on control information for defect relief, trimming of circuit characteristics or function switching.

A still further object of the present invention is to provide a semiconductor integrated circuit capable of reducing to a minimum, the frequency of rewriting of each nonvolatile memory cell in order to perform operation confirmation by control information for defect relief, trimming of circuit characteristics or function switching.

A still further object of the present invention is to provide a method of manufacturing a semiconductor integrated circuit, which enhances reliability of an operation based on control information for defect relief, trimming of circuit characteristics or function switching.

The above, other objects and novel features of the present invention will become apparent from the description of the present specification and the accompanying drawings.

Summaries of typical ones of the inventions disclosed in the present application will be described in brief as follows:

[1] A semiconductor integrated circuit according to the present invention has a plurality of circuit modules connected to a first wiring such as a common bus or the like and includes a fuse circuit which has a plurality of nonvolatile memory cells respectively storing control information for defect relief, trimming of circuit characteristics or function switching with respect to the plurality of circuit modules and which allows memory information to be electrically read therefrom. A plurality of volatile register circuits provided with a plurality of volatile memory cells to store the control information therein are adopted in association with the plurality of circuit modules every the plurality of circuit modules. The fuse circuit and the plurality of register circuits are connected by a dedicated second wiring for the purpose of transfer of the control information. A control circuit is provided which controls application of an operating voltage to each of the nonvolatile memory cells to enable reading of memory information from the fuse circuit, controls the transfer of the control information read from the fuse circuit to each of the register circuits through the second wiring, and performs control for releasing application of the operating voltage to each of the nonvolatile memory cells after reading of the control information from the fuse circuit to the second wiring.

In a further detailed one aspect of a semiconductor integrated circuit according to the present invention, a first register circuit is provided which includes a plurality of volatile memory cells for holding the control information read from the fuse circuit. The first register circuit and a plurality of second register circuits are respectively connected by the second wiring dedicated for the transfer of the control information. At this time, a control circuit performs control on application of a voltage enabling reading of the memory information from each of the nonvolatile memory cells of the fuse circuit to the nonvolatile memory cell, control on the transfer of the control information read from the nonvolatile memory cells to the first register circuit to the second register circuits through the second wiring, and control for releasing the application of the voltage enabling the reading of the memory information from the nonvolatile memory cells to the nonvolatile memory cells after the reading of the control information into the first register circuit.

According to the above means, each nonvolatile memory cell of the fuse circuit unsharing the first wiring like the common bus is used to store control information. Thus, it is possible to suppress deterioration in the reliability of storage of the control information, which is in danger of its manifestation where a flash memory intended for general purpose use is used to store the control information. In brief, nonvolatile memory cells each having reliability higher than reliability of information storage, which is ensured by the general-purpose memory, can be utilized.

Since the second wiring used to transfer the control information is a wiring dedicated therefor, it needs not perform switching between connections to circuit portions used for actual operations in the circuit modules and their control. Consequently, a circuit configuration for delivering the control information can be simplified.

Since the application of the operating voltage to each of the nonvolatile memory cells is released after reading of the control information from the fuse circuit to the register circuits (second register circuits), no electrical stress is applied to each of the nonvolatile memory cells of the fuse circuit even if an actual operating period of the semiconductor integrated circuit exists subsequently to its release. Even in such a viewpoint, the reliability of storage of the control information is enhanced.

As one preferable form of the present invention, the fuse circuit may be placed in one location of the semiconductor substrate. A high-voltage operated circuit necessary to write memory information can be concentratedly placed in one location, and a space used to make separation from a low-withstand circuit portion or to be away therefrom can be held to a minimum.

As one preferable form of the present invention, the operation of the control circuit may be started in response to an instruction for initializing the semiconductor integrated circuit. It is rational to perform the defect relief, the trimming of the circuit characteristics or the function switching for each circuit module immediately before an actual operation is started. In the case of a microcomputer, for example, it may be performed in accordance with power-on reset or system reset.

As one preferable form of the present invention, the individual register circuits may be series-connected to the circuit modules by the second wiring. Sequentially transmitting control information on a serial basis according to clock-synchronized shift register operations enables delivery of the control information to the plurality of register circuits. Described more specifically, the first register circuit is a shift register which holds control information parallel-outputted from the fuse circuit and outputs the same on a serial basis. The second register circuits are shift registers which have serial input terminals connected upstream of the second wiring, serial output terminals connected downstream of the second wiring, and parallel output terminals connected to their corresponding circuit modules.

As one preferable form of the present invention, testing external interface means may be provided which makes it possible to output information on the second wiring to the outside of the semiconductor substrate and to input data from outside to the second wiring. Testing control information inputted from outside can be directly loaded into its corresponding register circuit. The frequency of rewriting each nonvolatile memory cell to execute operation confirmation by control information for defect relief, trimming of circuit characteristics or function switching can be reduced to the utmost. Consequently, the possibility of deterioration of characteristics of each nonvolatile memory cell can be reduced.

As one preferable form of the present invention, the fuse circuit has a nonvolatile memory cell assigned for storage of a sign bit indicative of whether writing of control information into each of the nonvolatile memory cells has been done. The presence or absence of write completion of the control information can be easily recognized. It is possible to prevent deterioration of device characteristics and instability of information storage due to incorrect overwriting before they happen.

The control information stored in the fuse circuit may be used as any one of information for substituting a defective circuit module with a spare circuit module and control information for relieving a partial defect in each circuit module, or both information. Using the control information as both information provides convenience where the defect relief is hierarchically effected on the circuit modules. A method of substituting a circuit module with a spare circuit module is used when circuit modules constituting circuit functional units are arranged in plural form to constitute a functional unit.

[2] As one preferable form of the present invention, such a structure that upon a read operation, a channel current may not be passed or fed through each nonvolatile memory element and a large word line voltage may not be applied thereto, is adopted in each of the nonvolatile memory cell to thereby prevent the occurrence of inversion of data due to charge gain or the like. Namely, each of the nonvolatile memory cells may preferably include nonvolatile memory elements having first source electrodes, first drain electrodes, floating gate electrodes and control gate electrodes and capable of having different threshold voltages, read transistor elements having second source electrodes and second drain electrodes, having the floating gate electrodes as gate electrodes and capable of having mutual conductances (or switch states) different according to threshold voltages held by the nonvolatile memory elements, and a selection transistor which connects the read transistor elements to a read signal line.

For instance, when one threshold voltage of each of the nonvolatile memory elements is set to a relatively high threshold voltage (corresponding to a threshold voltage in a write state in which electrons are injected into a floating gate thereof), and the other threshold voltage is set to a low threshold voltage (corresponding to a threshold voltage in an erase state in which electrons are emitted from the floating gate2), each of the transistor elements is brought to a cutoff state in a high threshold voltage state and brought to an on state in a low threshold voltage state (its reverse might occur depending on conductivity type of each transistor element). The erase state of each nonvolatile memory element can be achieved by, for example, setting the first drain electrode and control gate electrode of the nonvolatile memory element to 0V like a circuit ground voltage, setting the first source electrode of the nonvolatile memory element to 6V and pulling out or drawing electrons from the floating gate electrode to the first source electrode by a tunnel current. The write state can be achieved by, for example, setting the first drain electrode and control gate electrode of each nonvolatile memory element to 5V, setting the first source electrode of the nonvolatile memory element to 0V like the circuit ground voltage, and injecting hot electrons generated at the first drain electrode into the floating gate.

Since the floating gate electrodes of the nonvolatile memory elements serve as the gate electrodes of the read transistor elements, the read transistor elements respectively take or assume switch states or mutual conductances corresponding to electron-injected states/electron-emitted states of the floating gate electrodes, in other words, write states/erase states. Thus, even if a select level is not applied to the control gates, a current corresponding to the switch states or the mutual conductance states can be passed or fed through the transmission means. Since no select level is applied to the control gate electrodes, depletion type MOS transistors may be adopted for the read transistor elements in terms of ensuring of the necessary amount of read signal.

On the other hand, when enhancement type MOS transistors are adopted for the read transistor elements, the select level may preferably be supplied to each control gate electrode even upon a read operation in terms of ensuring of the necessary amount of read signal. It can be also understood from such a format that the read transistor elements respectively have threshold voltages different according to the electron-injected states/electron-emitted states of the floating gate electrodes, in other words, write states/erase states.

From the above, there is no need to cause a channel current to flow through each of the nonvolatile memory elements according to the threshold voltage upon the read operation. Upon the read operation, the source electrodes and drain electrodes of the nonvolatile memory elements may be respectively set to a circuit ground potential like 0V. Thus, the injection of weak hot electrons from the first drain electrodes to the floating gates does not occur. When the control gate electrodes are also set to the circuit ground potential at this time, no tunnel current occurs either. Even if the select level is applied to each control gate electrode, no tunnel current occurs between the first drain electrode and the floating gate electrode. While a weak tunnel or the like might occur between the second drain electrodes of the read transistor elements, this is considered to present no problem if the select level of each control gate electrode is low. Thus, a problem associated with the inversion of data due to charge gain does not occur upon the read operation. Consequently, the performance of retaining data over a long period is enhanced and hence a reduction in read defective rate or fraction can be realized.

Each of the nonvolatile memory elements has a MOS capacitive element in which a capacitance electrode is provided over a first semiconductor region functioning as a control gate electrode with an insulating layer interposed therebetween, and a MOS transistor having a first source electrode, a first drain electrode and a gate electrode formed in a second semiconductor region. The capacitance electrode may adopt such a configuration as to be commonly connected to the gate electrode and function as a floating gate electrode.

[3] In order to further take data retention measures against each information memory cell subjected to charge gain measures by a pair structure of the nonvolatile memory elements and read transistor elements to thereby improve a read defective rate or fraction, the following configurations may be adopted.

Firstly, the nonvolatile memory elements and read transistor elements are respectively provided in pairs, and one read transistor element shares a floating gate electrode of one nonvolatile memory element, whereas the other read transistor element shares a floating gate electrode of the other nonvolatile memory element, and the pair of read transistor elements is series-connected to the selection transistor element. In such a configuration, the pair of nonvolatile memory elements is both programmed into a write state or an erase state. In the write states of both the nonvolatile memory elements, both the read transistor elements are respectively held in an off state. While the possibility that electrical charges held in the nonvolatile memory elements kept in the write state will leak therefrom due to some reasons, is not 0 at random, a serial path of the read transistor elements remains in a cutoff state even if the electrical charge held in one nonvolatile memory element leaks therefrom. The probability that the electrical charges retained in both the nonvolatile memory elements will leak therefrom, is extremely low. Consequently, data retention is improved and hence a read defective rate or fraction can be further reduced.

Secondly, the nonvolatile memory elements and read transistor elements are respectively provided in pairs, and one read transistor element shares a floating gate electrode of one nonvolatile memory element, whereas the other read transistor element shares a floating gate electrode of the other nonvolatile memory element, and the pair of read transistor elements is parallel-connected to the selection transistor element. In a manner similar to the above even in such a configuration, the pair of nonvolatile memory elements is both programmed into a write state or an erase state. Since the second example is placed on the assumption that the read transistor elements are different in conductivity type from the above, both the read transistor elements are held in an on state when the nonvolatile memory elements are respectively brought to the write state. While, at this time, the possibility that electrical charges retained in the nonvolatile memory elements held in the write state will leak therefrom due to some reasons, is not 0 at random, a parallel path of the read transistor elements remains in an on state even if the retained charge leaks from one of the nonvolatile memory elements. The probability that the electrical charges retained in both the nonvolatile memory elements will leak therefrom, is extremely low. Consequently, data retention is improved and hence a read defective rate or fraction can be further reduced.

[4] A method of manufacturing a semiconductor integrated circuit, according to the present invention, including a plurality of circuit modules, a fuse circuit which has a plurality of nonvolatile memory cells capable of writing therein control information for defect relief, trimming of circuit characteristics or function switching with respect to the plurality of circuit modules and which allows memory information to be electrically read therefrom, a dedicated wiring which allows the memory information of the fuse circuit to be delivered to the circuit modules, and testing external interface means which makes it possible to output information on the dedicated wiring to the outside of a semiconductor substrate and to externally input data to the dedicated wiring, comprises a first process for supplying control information from the testing external interface means to each of the circuit modules through the dedicated wiring, a second process for confirming an operation of each of the circuit modules in a supplied state of the control information, and a third process for writing control data in the fuse circuit according to the result of confirmation by the second process.

From the above, there is no need to write the control information in each nonvolatile memory cell on a case-by-case basis when the operation is confirmed based on the control information. Therefore, it is not necessary to rewrite each nonvolatile memory cell for the purpose of the operation confirmation. Consequently, the possibility that each nonvolatile memory cell will incur deterioration of characteristics thereof, is reduced.

BRIEF DESCRIPTION OF THE DRAWINGS

FIG. 13 is an explanatory diagram illustrating an information format for control information and the like;

DETAILED DESCRIPTION OF THE PREFERRED EMBODIMENTS

Figure 1:
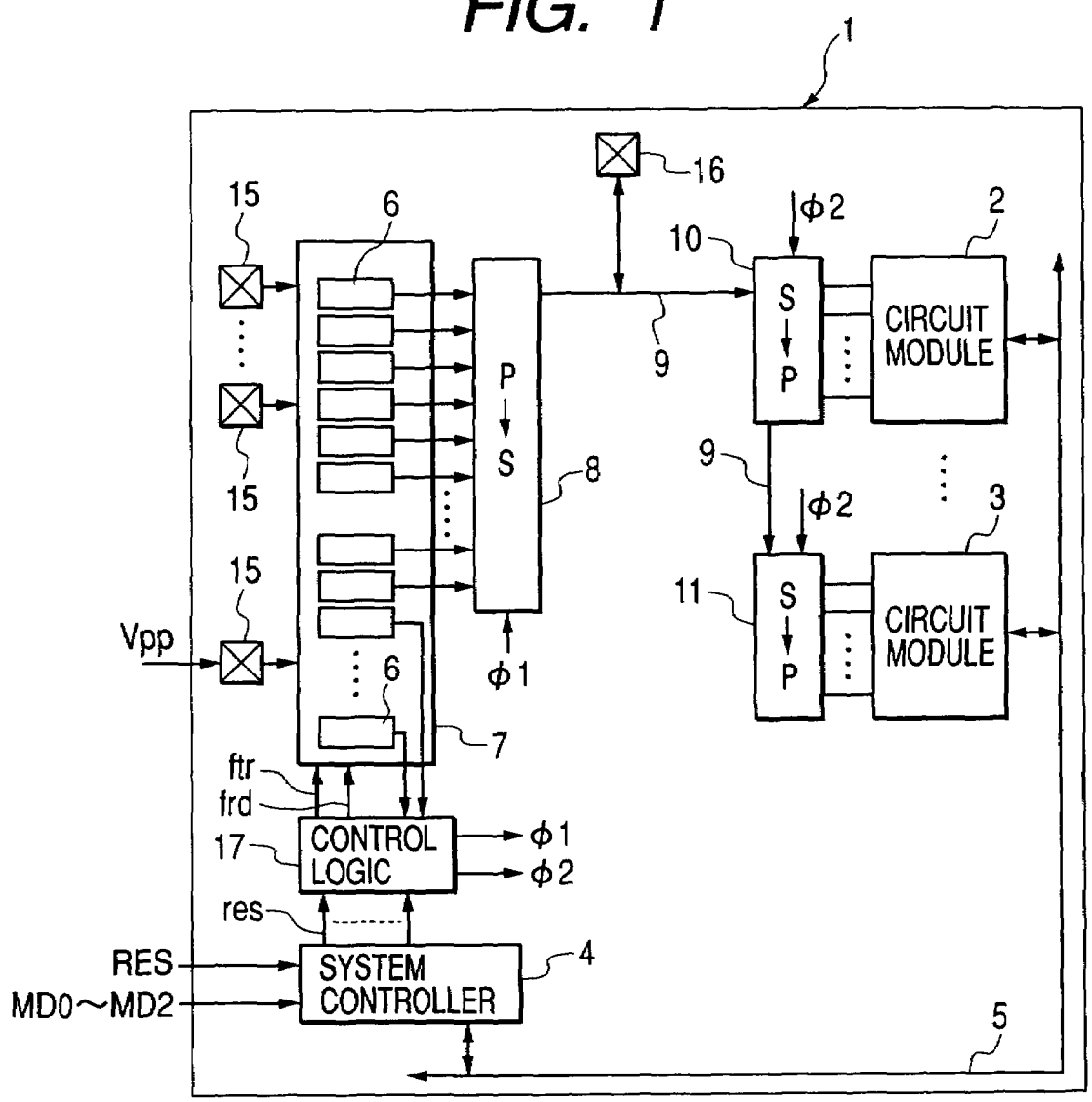
FIG. 1 is a block diagram showing one embodiment of a semiconductor integrated circuit according to the present invention.

FIG. 1 shows one embodiment of a semiconductor integrated circuit according to the present invention. The semiconductor integrated circuit 1 shown in the same drawing has typically-shown three circuit modules 2, 3 and 4. They are commonly connected to an internal bus 5 illustrative of one example of a first wiring. A fuse circuit 7 is provided which includes a plurality of nonvolatile memory cells 6 for storing therein control information used for defect relief, trimming of circuit characteristics and function switching with respect to the plurality of circuit modules 2 and 3 and which makes it possible to electrically read memory information therefrom. In the present embodiment, the fuse circuit 7 outputs the memory information of the nonvolatile memory cells 6 in parallel. The semiconductor integrated circuit 1 has a shift register 8 used as first register means, which is provided with a plurality of volatile memory cells for holding such parallel-outputted control information therein. Although not restricted in particular, the shift register 8 serially outputs the parallel-inputted control information in synchronism with a clock signal $\phi 1$. The serial output is transferred to a serial bus 9 used as a second wiring dedicated for the transfer of the control information. Shift registers 10 and 11 used as second register means are sequentially series-connected to the serial bus 9. The shift registers 10 and 11 are individually associated with the circuit modules 2 and 3 and include a plurality of volatile memory cells for storing the control information therein. Further, the shift registers 10 and 11 respectively have serial input terminals connected upstream of the serial bus 9, serial output terminals connected downstream of the serial bus and parallel output terminals connected to their corresponding circuit modules 2 and 3. The shift registers 10 and 11 respectively perform serial shift operations in synchronism with a clock signal $\phi 2$.

The circuit module 4 is a system controller, which inputs a reset signal RES and mode signals MD0 through MD2, etc. supplied from outside and controls an internal state or an operation mode of the semiconductor integrated circuit in accordance with instructions given by such signals.

In FIG. 1, test pads 15 constitute external interface terminals for writing relative to the fuse circuit 7, and a test pad 16 constitutes an external interface terminal for allowing the serial bus 9 to directly perform an input/output operation from outside. Although not illustrated in particular, it is needless to say that the test pads 15 and 16 may be connected to the outside through suitable external interface control circuits. Although not restricted in particular, the test pads 15 and 16 are dedicated to testing and disconnected from external terminals of a package. Alternatively, their input terminals are coupled to source voltage terminals of the package or ground voltage terminals of the circuit so that input states are fixed. Thus, the writing for the fuse circuit 7 and external interface of the serial bus 9 are respectively brought to a disabled state upon an actual operation of the semiconductor integrated circuit. One of the test pads 15 serves as a terminal to which a high voltage Vpp for writing of its corresponding nonvolatile memory cell 6 is applied.

A control logic designated at numeral 17 in FIG. 1 controls reading for the fuse circuit 7 and shift operations for the shift registers 8, 10 and 11. The control logic 17 performs, for example, control (read control) for forming or producing a voltage-applied state which enables reading of memory information from each nonvolatile memory cell 6 of the fuse circuit 7, control (delivery control) for transferring the control information read into the shift register 8 from the nonvolatile memory cell 6 to the shift registers 10 and 11 through the serial bus 9, control (power-off control) for releasing the voltage-applied state which enables reading of the memory information from the nonvolatile memory cell 6 after the reading of the control information into the shift register 8, etc. Although not restricted in particular, such a control operation is instructed by a signal res issued from the system controller 4 in response to an instruction of initialization by the reset signal RES. The start of the serial transfer operation under the delivery control is instructed by a signal ftr outputted from the control logic 17.

Figure 2:
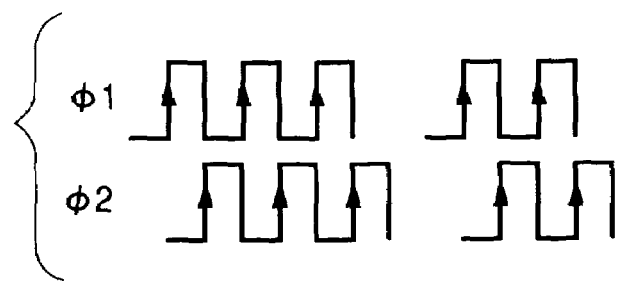
FIG. 2 is an explanatory diagram illustrating clock signal waveforms of shift registers.
Figure 3:
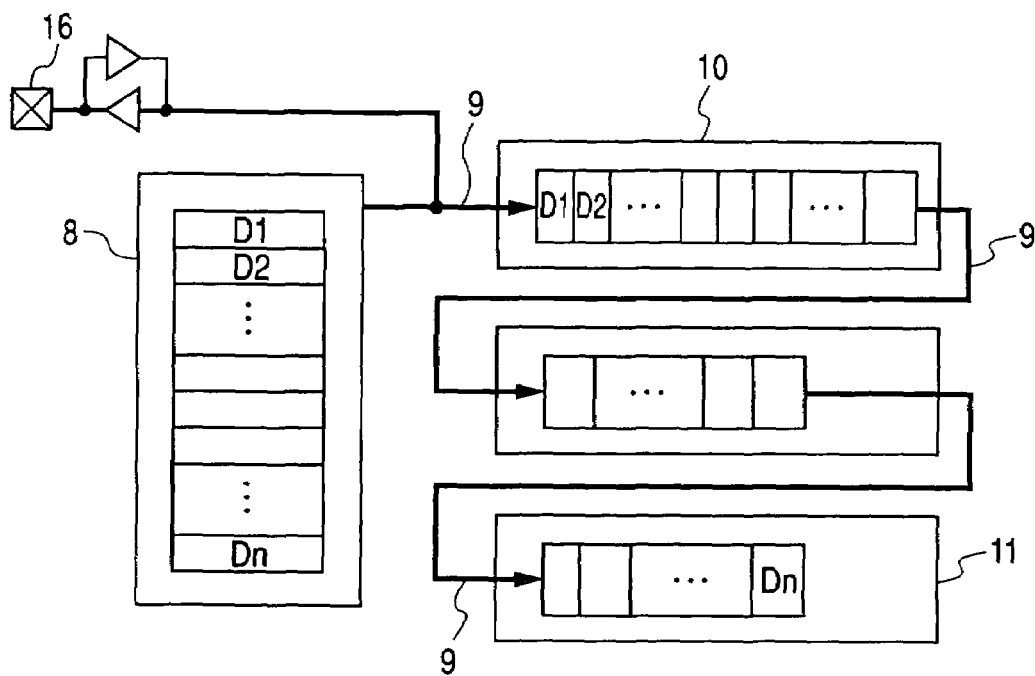
FIG. 3 is an explanatory diagram illustrating the manner of a serial delivery operation of control information.

The clock signals φ1 and φ2 are illustrated in FIG. 2 by way of example. The manner of the operation of serially delivering control information is illustrated in FIG. 3 by way of example. The control logic 17 outputs the clock signals φ1 and φ2 shifted by a ½ cycle from each other. The numbers of clock pulses of the clock signals φ1 and φ2 are respectively determined in advance according to the number of bits of serially-transferred control information. In the example shown in FIG. 3, the numbers of bits of all the shift registers 10 and 11 are n bits, and correspondingly necessary control information also result in n bits of D1 through Dn. At this time, the clock signals φ1 and φ2 respectively change n times in clock. Control on the change in clock is started after the control logic 17 has read the n-bit control data D1 through Dn from the nonvolatile memory cells 6 and parallel-transferred them to the shift register 8.

According to the above configuration for delivering the control information in the semiconductor integrated circuit 1, the nonvolatile memory cells 6 of the fuse circuit 7, which do not share the use of the internal bus 5 like a common bus, are used to store the control information. It is thus possible to suppress deterioration in the reliability of storage of the control information, which is in danger of its manifestation where the control information is stored in a flash memory intended for general purpose use. Since the serial bus 9 used for the transfer of the control information is a wiring dedicated for its transfer, it needs not perform switching between connections to circuit portions used for actual operations in the circuit modules 2 and 3 and their control. Consequently, the circuit configuration for delivering the control information can be simplified.

Figure 4:
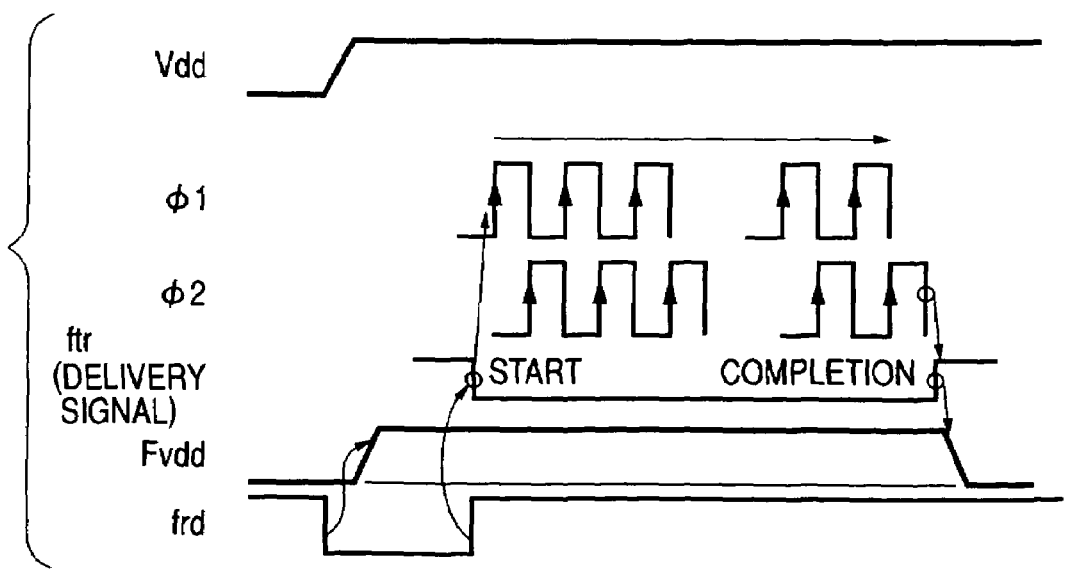
FIG. 4 is a timing chart illustrating the manner of power-off control on a fuse circuit.

The manner of the power-off control on the fuse circuit 7 is illustrated in FIG. 4 by way of example. Vdd indicates an external source or power supply, and Fvdd indicates an operating power supply for the fuse circuit, respectively. When the delivery signal ftr outputted from the control logic 17 is activated according to its corresponding signal res outputted from the system controller 4, changes in the clocks of the clock signals φ1 and φ2 are started. When the number of bits to be transferred is defined as n bits, for example, the control logic 17 changes clock pulses n times and thereafter changes the signal ftr to deactivation. In the fuse circuit 7 responsive to this change, a switch for supplying its operating power supply Fvdd is closed.

As another method of closing the switch for supplying the operating power supply Fvdd, a pulse counted value produced by a counter circuit may be set as a base. Alternatively, the transfer of information from the fuse circuit 7 to the shift register 8 is transfer-latched on one clock and thereafter the switch for supplying the operating power supply Fvdd may be closed.

According to the power-off control, the corresponding control information is read from the fuse circuit 7 and latched in the shift register 8. Thereafter, the operating power supply Fvdd of the fuse circuit 7 is cut off so that the voltage-applied state enabling reading of the memory information from each nonvolatile memory cell 6 is released. Therefore, even if an actual operating period of the semiconductor integrated circuit exists subsequently to its release, no electrical stress is applied to each nonvolatile memory cell 6 of the fuse circuit 7. Even in such a viewpoint, the reliability of the storage of the control information is enhanced.

Figure 5:
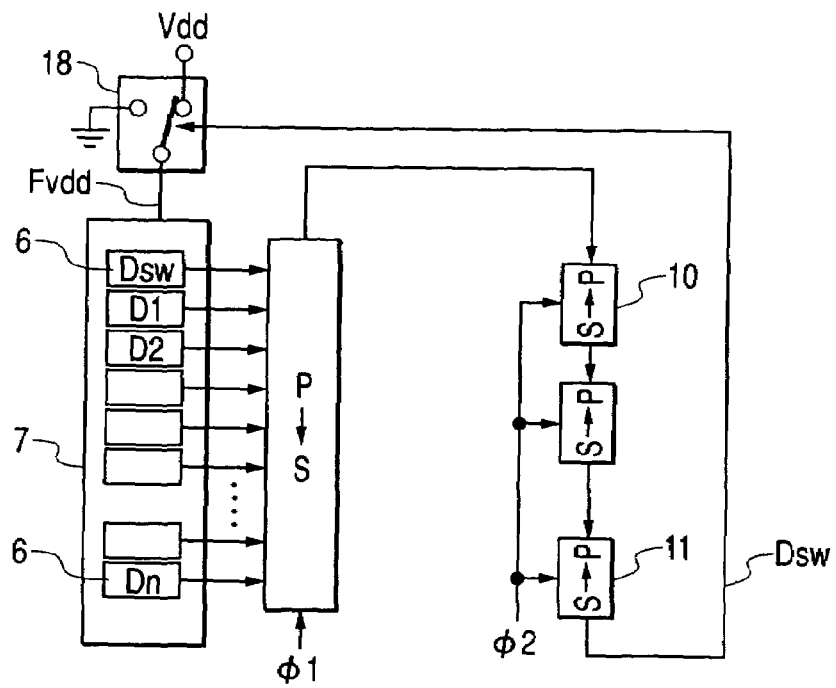
FIG. 5 is a schematic block diagram showing another example of the power-off control.

Another example of the power-off control is shown in FIG. 5. An operating power supply Fvdd for a fuse circuit 7 is supplied through a switch circuit 18. A switch control signal for the switch circuit 18 serves so as to turn on a switch at a logic value "1" and turn off the switch at a logic value "0". Upon a reset operation of the semiconductor integrated circuit, a node for the switch control signal is forced to the logic value "0". In the same drawing, a switch control bit Dsw corresponding to the logic value "0" is stored in one memory cell 6 in a nonvolatile memory 7 and placed at the head of control information D1 through Dn to thereby perform serial transfer. Prior to a read operation of the fuse circuit 7, respective bits of the shift registers 8, 10 and 11 are initialized into the logic value "1" so that the operating power supply Fvdd is supplied to the fuse circuit 7. Upon serial transfer, the switch control bit Dsw overflows the shift register 11 corresponding to a final stage and is then supplied to the switch circuit 18. The so-overflowed switch control bit Dsw is used as the switch control signal for the switch circuit 18. When the switch control signal is of the logic value "0", the switch circuit 18 cuts off a power supply voltage Vdd to stop the supply of the operating power supply Fvdd to the fuse circuit 7.

In order to initialize each of the bits of the shift registers 8, 10 and 11 into the logic value "1", although not shown in the drawing, a reset control signal may be supplied from a control logic 17 to each of the shift registers 8, 10 and 11 to realize their initialization, or the logic value "1" may be shift-inputted from a test pad 16 to each of the bits of the shift registers 10 and 11 via a serial bus 9.

Figure 6:
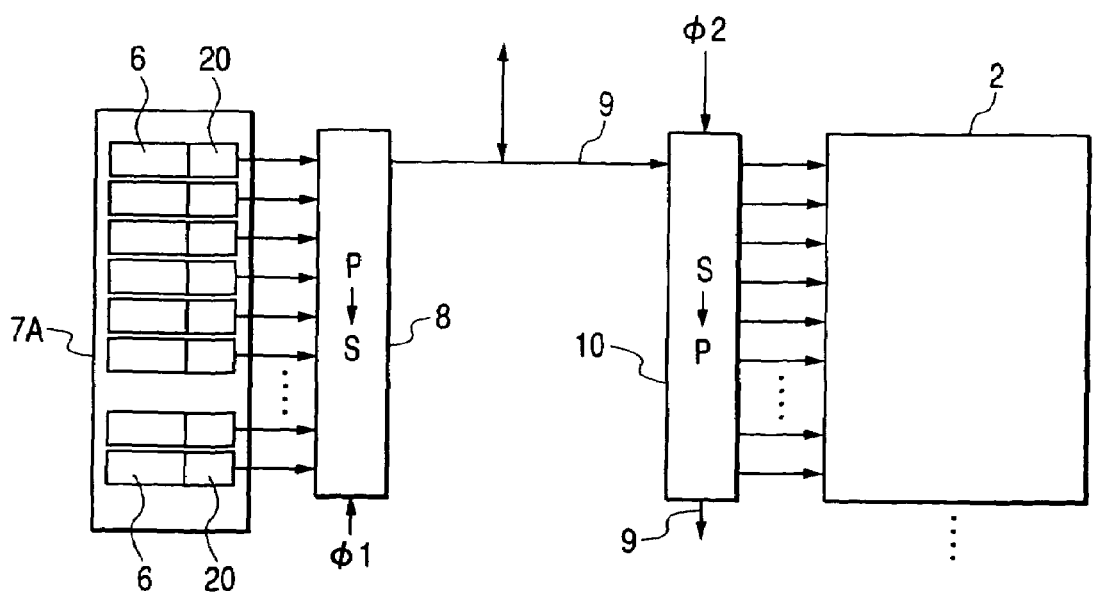
FIG. 6 is a schematic block diagram illustrating a serial delivery configuration wherein a fuse circuit is adopted which includes latch circuits at stages subsequent to nonvolatile memory cells of the fuse circuit, and outputs of the latch circuits are supplied to a shift register.

A serial delivery configuration wherein a fuse circuit 7A having latch circuits 20 at stages subsequent to nonvolatile memory cells 6 thereof is adopted and outputs produced from the latch circuits 20 are supplied to a shift register 8, is illustrated in FIG. 6 by way of example. Since FIG. 6 is similar to FIG. 1 in other configurations, their detailed description will be omitted.

Figure 7:
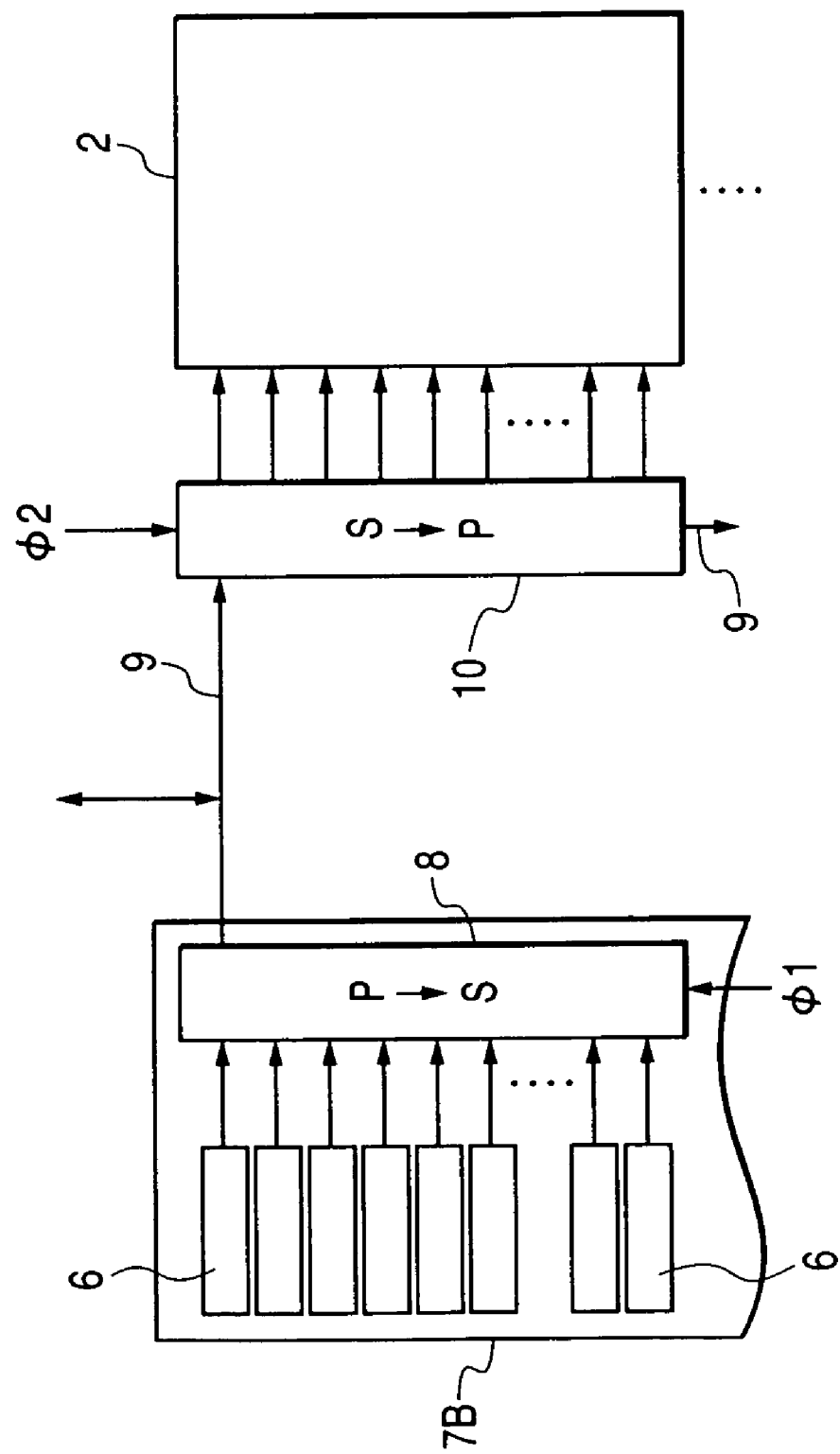
FIG. 7 is a schematic block diagram illustrating a serial delivery configuration wherein circuits 6 and 8 shown in FIG. 1 are positioned to a fuse circuit with their functions utilized in combination.

A serial delivery configuration wherein the circuits 6 and 8 in FIG. 1 are positioned to a fuse circuit 7B with their functions being utilized in combination, is illustrated in FIG. 7 by way of example. When the fuse circuit 7B and circuit modules 2 and 3 are respectively constructed using circuit modules called IP (Intellectual Property), the number of circuits to be prepared as circuit modules other than the IP modules results in the number reduced one shift register from the configurations shown in FIGS. 1 and 6. Since the shift registers 8 shown in the same drawings are also capable of holding write data for each nonvolatile memory cell 6 of the fuse circuit 7 at this time, a bidirectional function for delivery and writing, i.e., a bidirectional input/output function may be provided for it.

Figure 8:
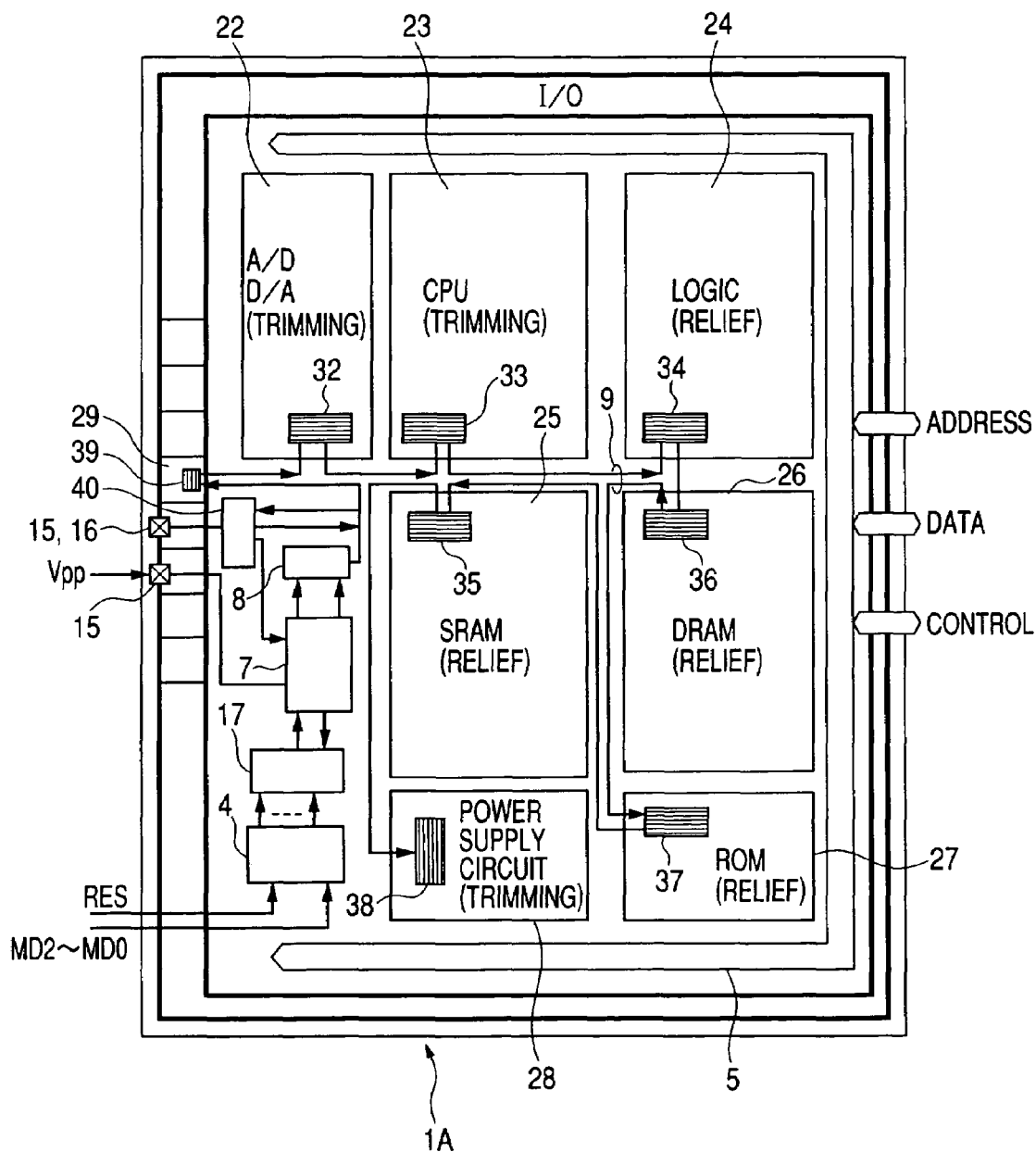
FIG. 8 is a block diagram showing another specific embodiment of FIG. 1.

Another specific embodiment of FIG. 1 is shown in FIG. 8. In the same drawing, the present embodiment is provided with an A/D·D/A converter 22, a CPU 23, a logic circuit (LOGIC) 24 constituting an accelerator of the CPU 13, an SRAM (Static Random Access Memory) 25, a DRAM (Dynamic Random Access Memory) 26, a ROM (Read Only Memory) 27, a power circuit 28 and an input/output port (IO) 29 as circuit modules (circuit blocks, circuit units, circuit portions) intended for defect relief, trimming of circuit characteristics or function switching. If these circuits respectively take such a configuration that control information is used for the defect relief as viewed on the drawing, then the term "(relief)" is affixed thereto for convenience. If they respectively take such a configuration that the control information is used for trimming of the circuit characteristics, then the term "(trimming)" is affixed thereto for convenience. Reference numerals 32 through 39 indicate shift registers assigned to the circuit modules, respectively. The circuit modules 22 through 29 are connected to an internal bus 5.

Although not restricted in particular in FIG. 8, a test interface circuit 40 based on JTAG (Joint Test Action Group), which is used in a device test or the like, is utilized for an external interface for a write process or the like on a fuse circuit. The test interface circuit 40 is used even for the external direct input and output of data from and to a serial bus 9. While clock control on the shift registers 32 through 39 are not shown in the drawing in particular upon the external direct input of data from the serial bus 9, the data may be inputted via the test interface circuit 40 or supplied while a probe terminal of a tester is being brought into contact with its corresponding pad electrode provided at a path for supplying the clock signal φ2.

Figure 9:
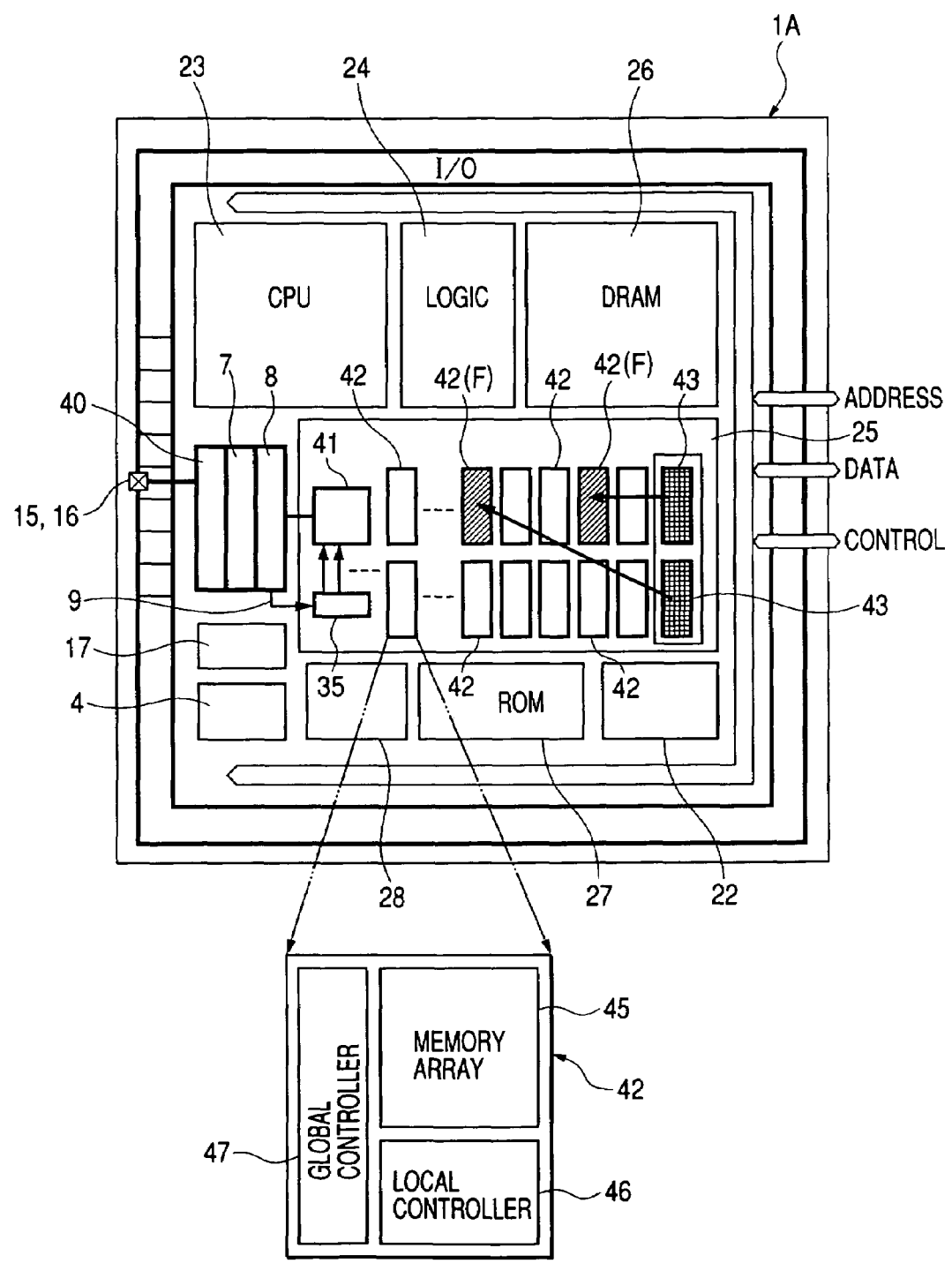
FIG. 9 is a block diagram showing one example of a method of relieving a large-scale circuit module made up of a set of the same small-scale circuit blocks.

One example of a method of relieving a large-scale circuit module made up of a set of small-scale circuit blocks identical to one another is shown in FIG. 9. A relieving method used in small-scale memory block units when sixteen small-scale memory blocks each like 16K bytes are collected to thereby bring the SRAM of FIG. 8 into large capacity, is illustrated in the same drawing by way of example. In the present example, an SRAM 25 has a shift register 35 which receives control information therein. The control information latched in the shift register 35 is supplied to the whole control circuit 41 or the like of the SRAM 25. The SRAM 25 includes sixteen normal memory blocks 42, and two relieving memory blocks (redundancy memory blocks) 43. A fail or defective normal memory block (fail memory block) 42 (F) is replaced with its corresponding redundancy memory block 43. As information (redundancy program information) for instructing this replacement, the specific control information latched in the shift register 35 is used. The control circuit 41, which accepts the control information or the like from the shift register 35, performs control on its replacement.

The memory blocks 42 and 43 are respectively designed using design parts provided as the same IP modules. Each of the memory blocks 42 and 43 comprises a memory array 45, a local controller 46 made up of control circuits inherent in the memory array 45, such as an address decoder, a sense amplifier, etc., and a global controller 47 for controlling the operations of the memory blocks 42 and 43 in response to the global control information from the control circuit 41 or the like.

Figure 10:
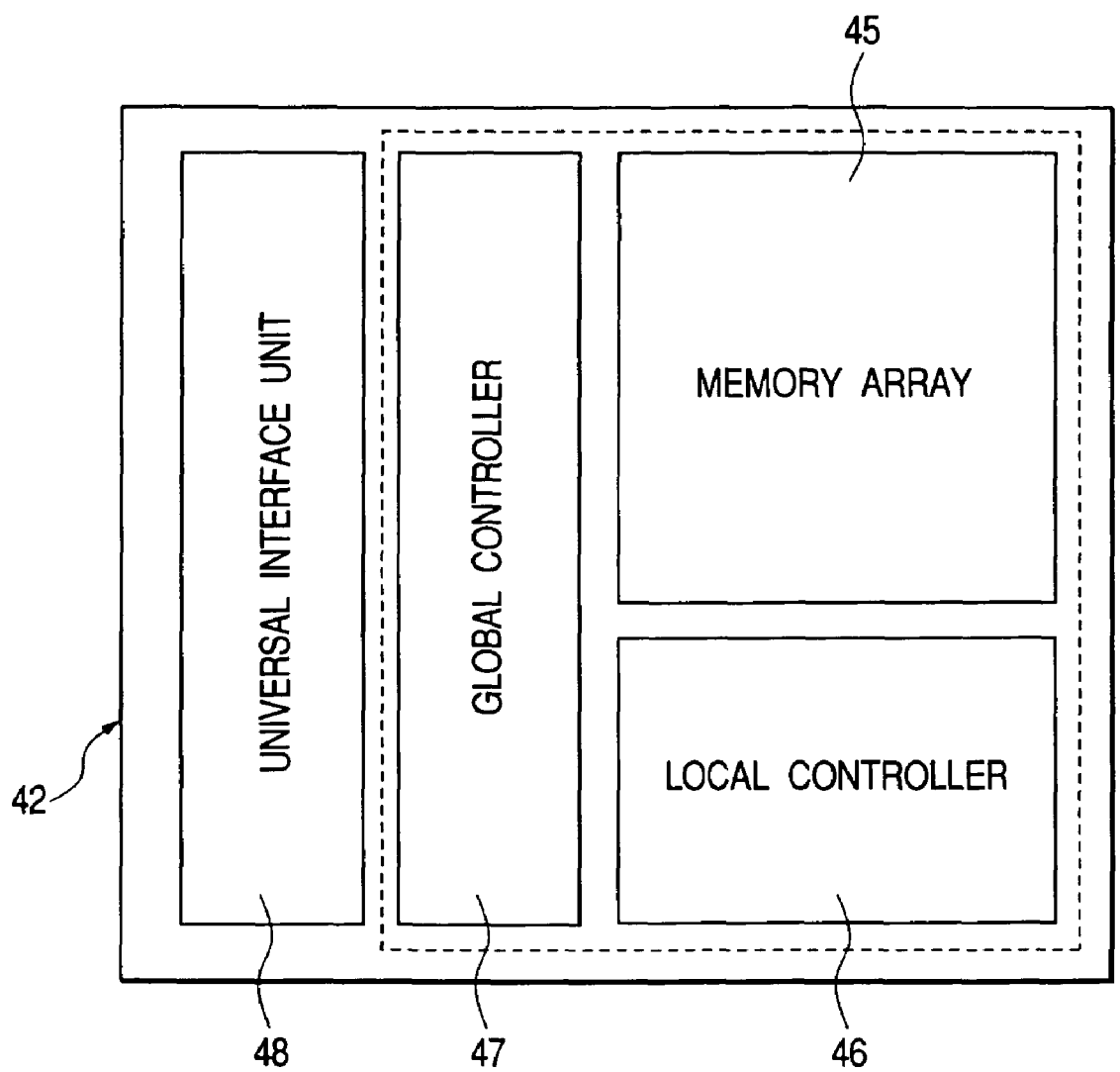
FIG. 10 is a block diagram showing an expansive another example of a memory block.

As illustrated in FIG. 10 by way of example, each of the memory blocks 42 and 43 may have one interface form selected from interface forms capable of selecting an interface to the outside as in clock synchronism or asynchronism or the like, as a universal interface unit 48.

Figure 11:
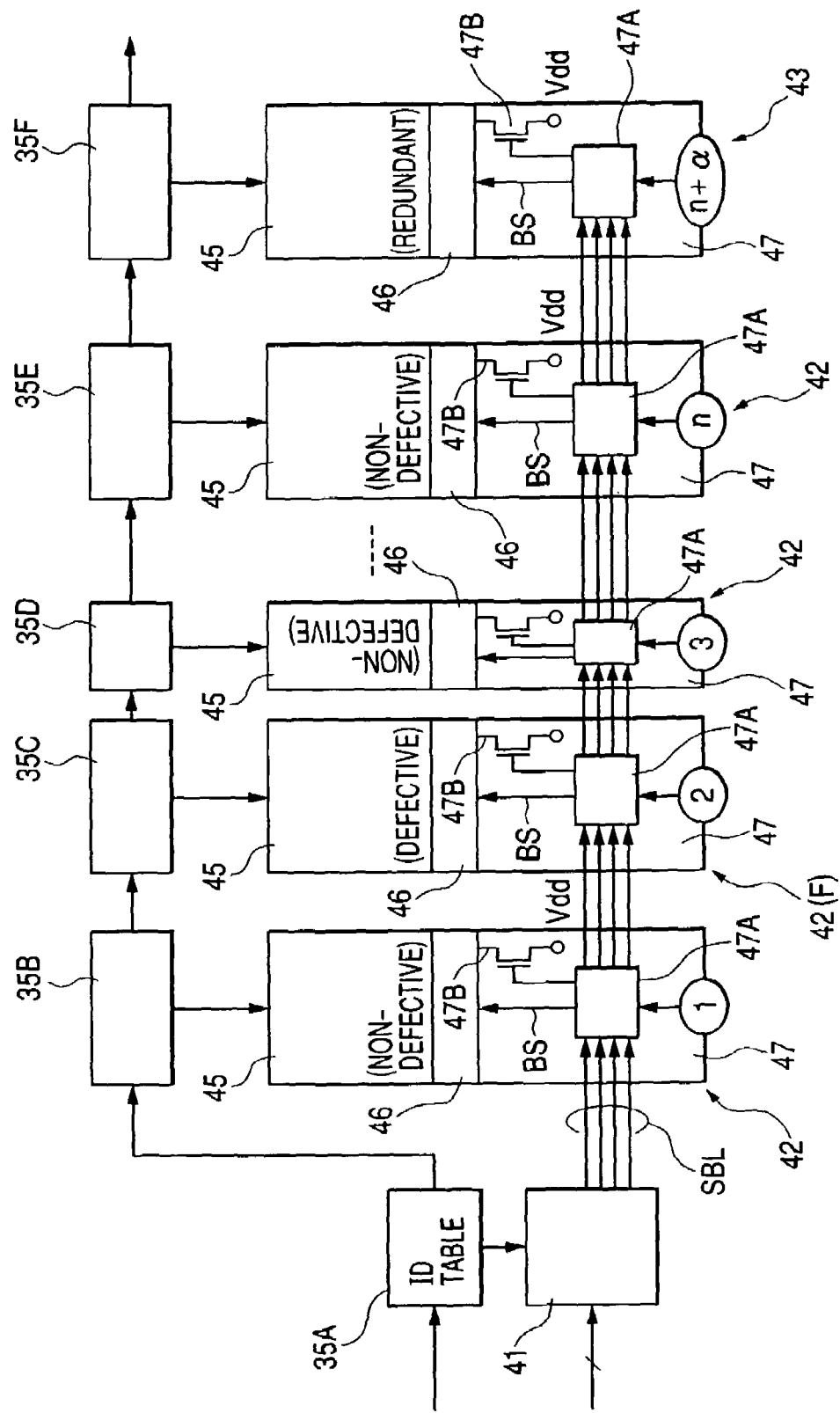
FIG. 11 is a schematic block diagram illustrating a configuration in which a defective memory block is substituted with another.

A configuration in which a defective or fail memory block is replaced with another, is illustrated in FIG. 11 by way of example. Respective global controllers 47 of memory blocks 42 and 43 respectively have block ID numbers assigned to themselves. ID numbers from 1 to n are assigned to the normal memory blocks 42, and an ID number of n+α is assigned to a redundancy memory block 43. Upon a memory access operation, the control circuit 41 supplies memory block select information SBL and in-memory block access address signals (not shown) to their corresponding memory blocks. In the present example, the memory block select information SBL is defined as ID number information for each memory block attempt to select an operation. Each of the memory blocks 42 and 43 has a comparator 47A for comparing the memory block select information SBL and an inherent ID number. When the result of comparison by the comparator 47A shows coincidence, the global controller 47 related to the coincidence enables its corresponding local controller 46 according to a block select signal BS to thereby allow the operation of selecting each memory cell with respect to the corresponding in-memory block address signal, the operation of writing or reading data to and from the selected memory cell, etc. In each memory block related to the non-coincidence of the result of comparison, the global controller 47 related to the non-coincidence disables its corresponding local controller 46 and cuts off a power switch 47B of a memory block 45 to inhibit a memory operation in the corresponding memory block. When the controller 41 generates memory block select information SBL in accordance with an access address signal supplied from a CPU or the like through an internal bus 5, it refers to relief information of an ID table 35A positioned as part of the shift register 35 and generates the corresponding memory block select information SBL so that a defective memory block is replaced by a redundancy memory block. Namely, the ID table 35A holds, as relief information, each pair of ID number information of each defective memory block and ID number information of each redundancy memory block with which it is substituted. The controller 41 retrieves whether an ID number of a memory block designated or specified by an access address signal supplied from the CPU or the like coincides with a defective or fail ID number registered in the ID table 35A. If they are found not to coincide with each other, then the controller 41 outputs the ID number of the memory block designated by the access address signal as it is. If they are found to coincide with each other, then the controller 41 outputs information about a redundant ID number pairing with the fail ID number. Consequently, defective memory blocks are substituted with their corresponding redundancy memory blocks in memory block units to thereby relieve the defective memory blocks.

In-block relief information registers 35B through 35F, which constitute parts of the shift registers 35, hold relief information for individually relieving defects lying within their corresponding memory blocks 45. The relief information are information for specifying defective addresses for relieving defective or fail memory cells in word line units or bit line units, by X address information or Y address information. Since a configuration for the relief may apply the known technology for relieving defects or failures lying inside a memory LS, its detailed description will be omitted here. The substitution of the defective memory blocks in the memory block units is intended for memory blocks having defects unrelievable within memory blocks. Defect relieving can be hierarchically effected on respective circuit modules.

Figure 12:
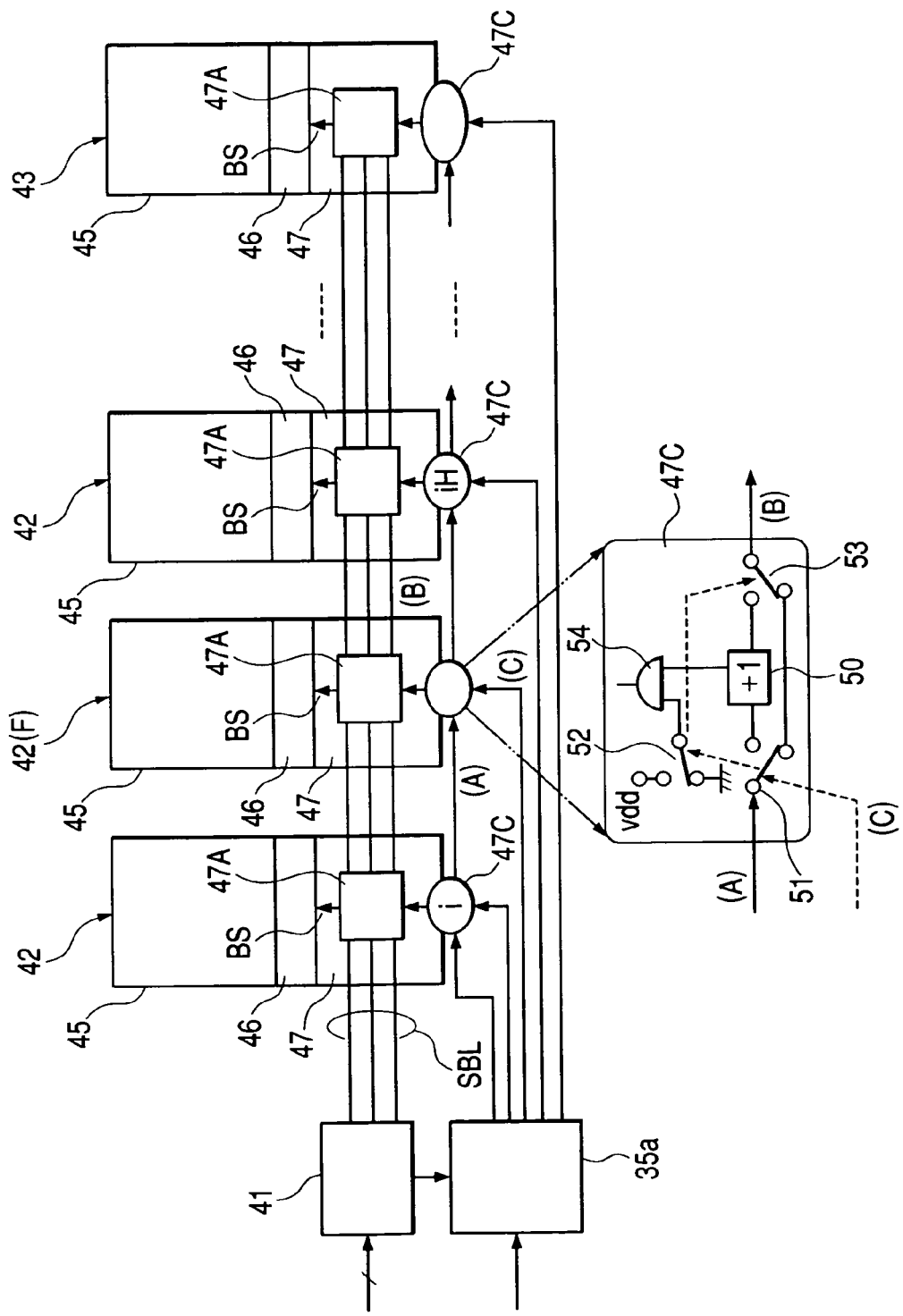
FIG. 12 is a schematic block diagram illustrating another configuration in which a defective memory block is substituted with another.

Another configuration in which a defective or fail memory block is substituted with another, is illustrated in FIG. 12 by way of example. FIG. 12 is different from FIG. 11 in that ID numbers of memory blocks 42 and 43 are variable. Namely, no significant ID numbers are given to the fail memory block and an invalid number, e.g., a value "0" is given thereto. Each of the memory blocks 42 and 43 has an ID control block 47C capable of variably setting an ID number. The ID control block 47C has a +1 increment counter 50 and inputs a count value sent from a preceding stage from a terminal (A). The ID control block 47C selects by a switch 51 whether the input count value should be bypassed or incremented by the increment counter 50. The ID control block 47C transmits the bypassed count value or the value incremented by the increment counter 50 from a terminal (B) to the following stage through a switch 53. When a switch 52 is in an off state, a selection gate 54 supplies the count value of the increment counter 50 to its corresponding comparator 47A as an ID number, whereas when the switch 52 is in an on state, the selection gate 54 outputs an invalid number of ID. The switches 51, 52 and 53 are switch-controlled by a control signal inputted from a terminal (C). In a first switch state shown in FIG. 12, the switches 51, 52 and 53 bypass ID number information sent from the preceding stage to send it to the following stage, thereby supplying an invalid number to the corresponding comparator 47A. In a second switch state opposite to the first switch state, ID number information sent from the preceding stage is incremented, followed by supply to the following stage and the corresponding comparator 47A. Control signals supplied to the ID control blocks 47C are given by control information latched in ID tables 35a corresponding to parts of the shift register 35, which are individualized every ID control blocks 47C. An initial value supplied from a terminal (A) to a first-stage ID control block 47C is given by control information latched in the corresponding ID table 35a. Thus, if an ID control block 47C is controlled to the second switch state with respect to a fail memory block 42, then no significant ID number is assigned to the corresponding fail memory block 42, and the fail memory block 42 is omitted from objects for operation selection by memory block select information SBL. In brief, the assignment of ID numbers to the memory blocks 42 and 43 is variably controlled. When the initial value supplied to the terminal (A) of the first-stage 1D control block 47C is set as "i−1", for example, an ID number of a first-stage memory block 42 is set to "i". If the first switch state is selected for an ID control block 47C of a next-stage memory block at this time, the ID number of the corresponding memory block results in "i+1". On the other hand, if the second switch state is selected for the ID control block 47C of the next-stage memory block, then the ID number of the corresponding memory block becomes invalid. If the first switch state is selected for an ID control block 47C of a memory block subsequent to the next-stage memory block, then the ID number of the corresponding memory block results in "i+1".

Incidentally, the in-block relief information registers 35B through 35F constituting the parts of the shift register 35 described in FIG. 11 are not shown in FIG. 12. Defect or fail relieving may not be hierarchically effected on the circuit modules without providing the in-block relief information registers 35B through 35F.

Figure 13:
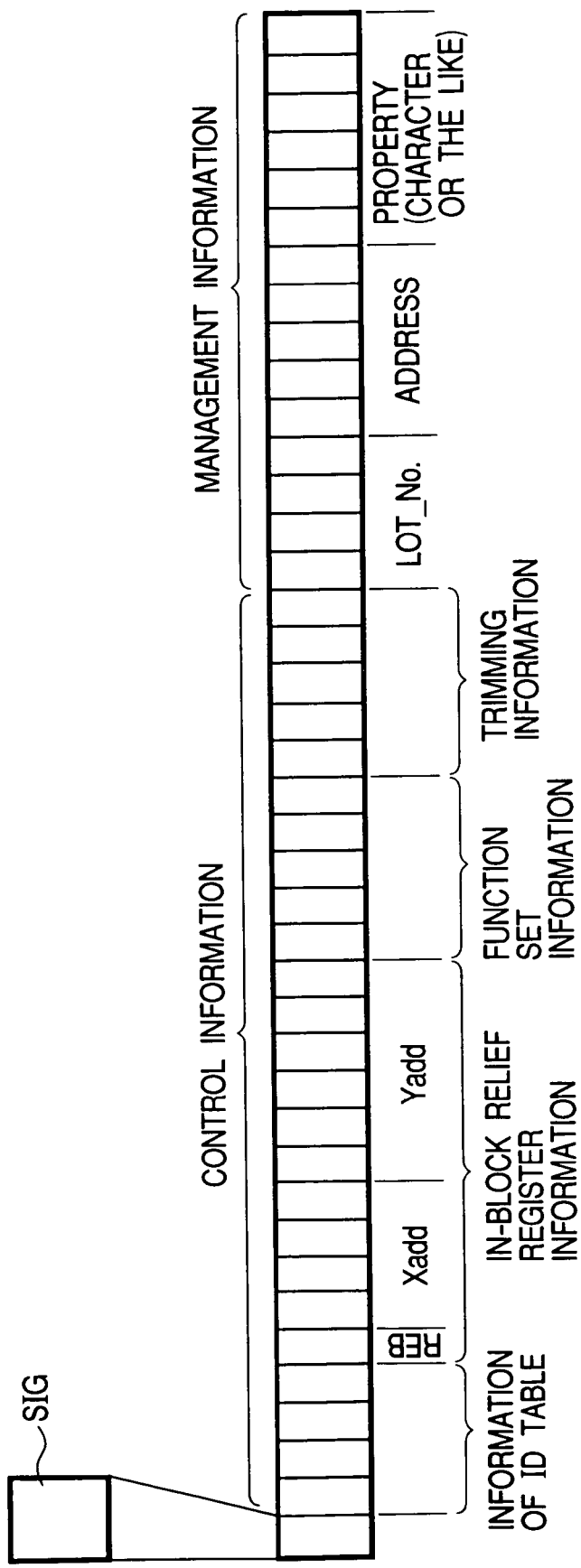

An information format for the control information and the like is illustrated in FIG. 13 by way of example. A sign bit SIG is provided at the head thereof, followed by the control information, and management information is finally added thereto.

The sign bit SIG is defined as information indicative of the presence or absence of writing of control information such as relief information for the fuse circuit 7, whether a relieved chip is good or bad, etc. Reading the sign bit SIG outside a chip makes it possible to determine the presence or absence of relief of a chip, etc. When a decision as to a non-defective unit or product and a relieved unit or product is represented in the form of one bit where the sign bit SIG is expressed in one bit, a non-defective product to which relief information has been written, is expressed in "1", a non-defective product with no relief information written therein is expressed in "0", and a defective or fail product is represented by another identifier. When 2 bits are used, one bit indicates the presence or absence of writing, and the other one bit is indicative of pass/fail. Using the sign bit SIG enables prevention of rewriting into a once-written device. Further, deterioration in the characteristic of each memory cell due to an interruption of a P inspection (probe test) made to a wafer in which the P inspection has been executed halfway once, due to some causes, and such overwriting that data writing is effected on the same chip again, can be prevented when data is written into a fuse circuit.

The control information includes, for example, the information of the ID tables 35A and 35a, information of the in-block relief registers 35B through 35F, function set information and trimming information. The information of the ID tables 35A and 35a are as described above. The information of the in-block relief registers 35B through 35F may include a memory's relief enable bit REB, an X address Xadd for a memory to be relieved, a Y address Yadd for the memory to be relieved, etc. As the function set information, may be mentioned, select information for signal specs (CMOS level interface, and TTL level interface) of an external interface at the input/output port 29, etc. As the trimming information, may be mentioned, for example, information about resistance-value trimming of resistance voltage dividers in the A/D·D/A converter 22 and the power circuit 28, etc.

As the management information, may be mentioned a production lot number (LOT_No.) of each semiconductor integrated circuit, a chip address on a wafer, and information about device characteristics such as a threshold voltage Vth of each MOS transistor, a source-to-drain current Ids, etc.

Figure 14:
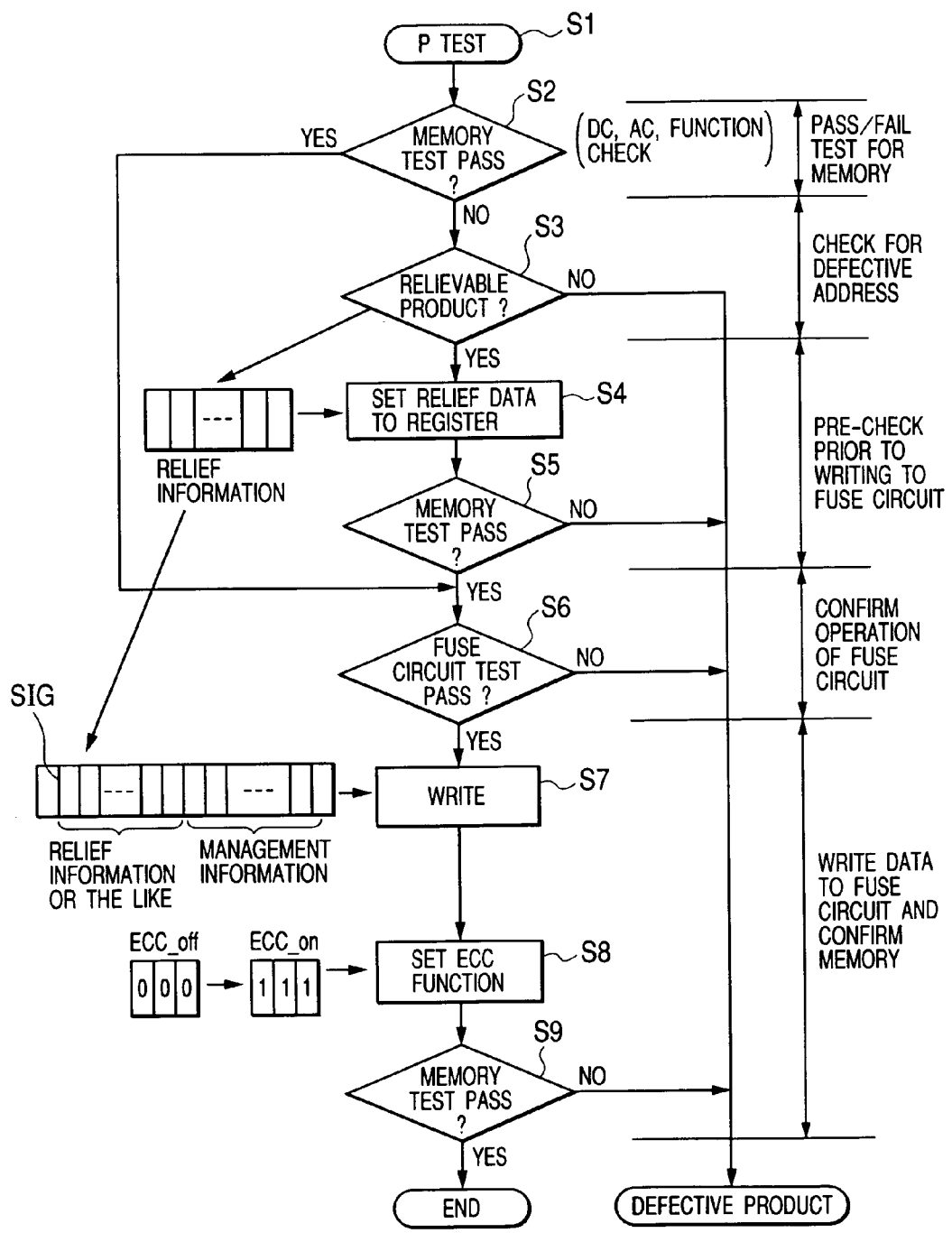
FIG. 14 is a flow chart illustrating a processing flow for executing writing and verification for a fuse circuit in the process of manufacturing a semiconductor integrated circuit.

A processing flow for executing writing and verification for the fuse circuit 7 in the process of manufacturing a semiconductor integrated circuit is illustrated in FIG. 14 by way of example.

The same drawing shows, for example, application to a memory test for the SRAM 25 as one example. First, respective tests for AC, DC and functions are effected on a chip for each semiconductor integrated circuit according to a probe test in a wafer state (S1). A pass/fail decision is made based on test results (S2). A reliable decision as to a defective or fail product is made in terms of functions, DC characteristics, etc. (S3). An unreliable chip is regarded as a defective or fail product. As to a reliable chip, relief data is set to a shift register 35 of the chip (S4). The operation of its setting is performed by supplying data to the serial wiring 9 via the test pad 16 through the use of a tester according to the format illustrated in FIG. 13 as described above. Clock control (shift control) on the shift register 35 or the like at this time may be performed by supplying a clock signal from the tester to signal pads for the clock signal φ2 via a probe. The SRAM 25 or the like is operated in a state in which relief information has been set to the shift register 35 or the like to thereby verify whether its memory operation is normal (S5). Although not shown in the drawing in particular, there may be cases in which the shift register setting process in Step S4 and the memory test operation in Step S5 are performed in parts on several occasions under conditions in which a value set to the shift register is changed and made different. Even in such a case, the shift register may be loaded with data, and there is no need to rewrite information stored in each nonvolatile memory cell.

If the memory operation is found to be finally abnormal upon the memory test in Step S5, then the chip is regarded as a defective or fail product. Verification as to whether the test of the fuse circuit 7 is properly effected on the chip having passed the memory test, is next made (S6). If the fuse circuit 7 is found to be improper, then the chip is judged to be defective. If the fuse circuit is found to be normal, then a sign bit, control data such as relief information, etc., and the management information are written into the fuse circuit 7 (S7). Further, an ECC function is now set to the memory information of the fuse circuit 7 (S8). In brief, an error-correcting code of one bit with respect to the control information and the management information or the like written in Step S7 is generated and added to the fuse circuit 7 to thereby enable an error detection/correction to the information read from the fuse circuit 7. After settings to the fuse circuit 7 have been perfectly completed, the chip for the semiconductor integrated circuit is operated under an actual operation using the memory information of the fuse circuit 7 to execute its test. If the chip is found to be normal, then the semiconductor integrated circuit is regarded as a relieved non-defective chip. If the chip is found to be improper, then it is regarded as a defective or fail chip.

Figure 15:
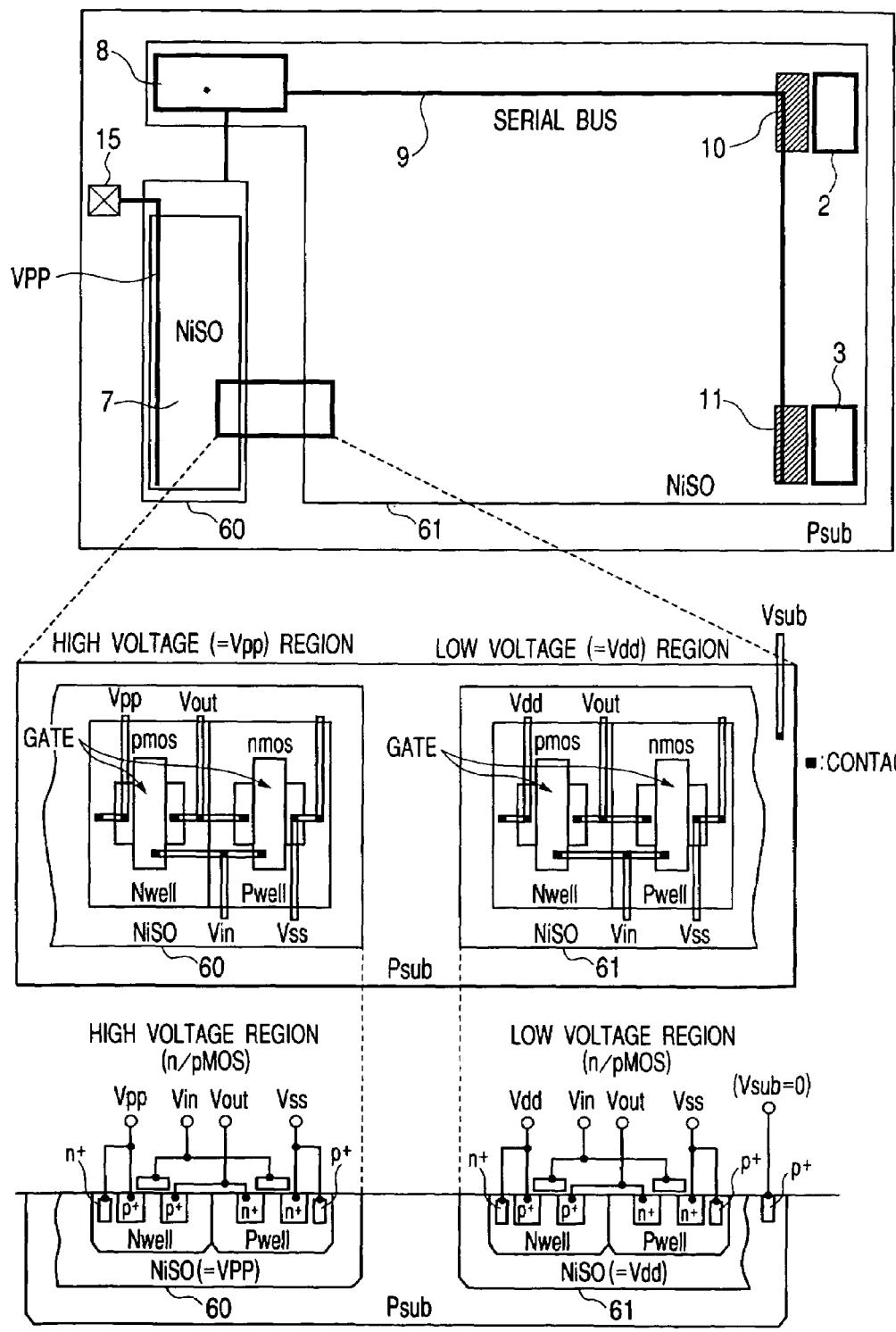
FIG. 15 is an explanatory diagram illustrating the layout of a fuse circuit on a chip.

A layout of a fuse circuit on a chip is illustrated in FIG. 15 by way of example. The fuse circuit 7 is concentratedly placed in one location on the chip and not provided in a dispersed form. Since the fuse circuit 7 makes use of a high voltage upon its writing, it is formed in a high voltage region (high-withstand region) 60. Since other circuit modules 2 and 3 such as a CPU 23, an SRAM 25, a DRA 26, etc. excluding a partial circuit for interfacing with the outside, e.g., the IO 29 need no high-voltage withstanding and give high priority to their high-speed operations, they are formed in a low voltage region (low-withstand region) 61. A plan view and a longitudinal sectional view of a CMOS inverter formed in a partial region extending from the high voltage region 60 to the low voltage region 61 are illustrated in FIG. 15 by way of example. The high-withstand region 60 and the low-withstand region 61 must be separated with a spacing defined therebetween as a separation region. If the high voltage region 60 is concentratedly placed in one location, it is then easy to reduce the area of a separation region necessary as a whole as compared with its disperse layout.

Nonvolatile memory cells employed in the fuse circuit 7 will next be described.

Figure 16:
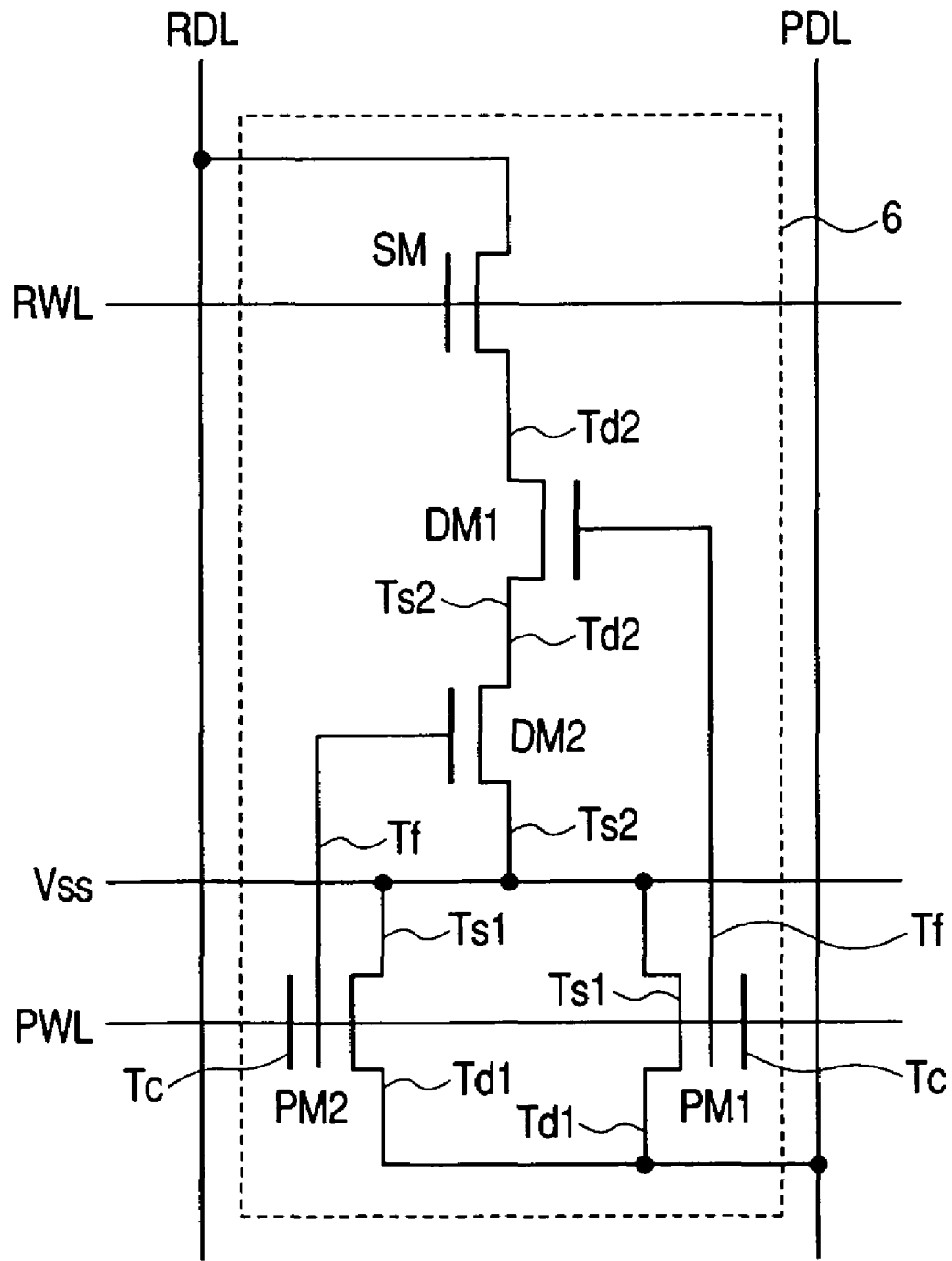
FIG. 16 is a circuit diagram illustrating a nonvolatile memory cell employed in the fuse circuit.

A nonvolatile memory cell adopted for the fuse circuit 7 is illustrated in FIG. 16 by way of example. The present nonvolatile memory cell 6 has a pair of nonvolatile memory elements PM1 and PM2 having first source electrodes Ts1, first drain electrodes Td1, floating gate electrodes Tf, and control gate electrodes Tc and capable of having threshold voltages different from each other, series-connected read MOS transistors DM1 and DM2 which respectively have second source electrodes Ts2 and second drain electrodes Td2 and which use the floating gate electrodes Tf as gate electrodes and are capable of having mutual conductances (or switch states) different according to threshold voltages held by the nonvolatile memory elements PM1 and PM2, and a selection MOS transistor SM which connects the MOS transistors DM1 and DM2 to a read signal line RDL. The control gate electrodes Tc of the nonvolatile memory elements PM1 and PM2 are commonly connected to a write word line PWL. The common source electrode Ts1 of the nonvolatile memory elements PM1 and PM2 are series-connected to the read MOS transistor DM1 and DM2. The common drain electrodes Td1 of the nonvolatile memory elements PM1 and PM2 are commonly connected to a write data line PDL.

The MOS transistors DM1 and DM2 are respectively brought to a cutoff state in high threshold voltage states (corresponding to states of threshold voltages in write states in which electrons are injected into floating gates) of the nonvolatile memory elements PM1 and PM2. The MOS transistors DM1 and DM2 are respectively brought to an on state in low threshold voltage states (corresponding to states of threshold voltages in erase states in which electrons are emitted from the floating gates). The erase states of the nonvolatile memory elements PM1 and PM2 can be achieved by, for example, setting the first drain electrodes Td1 and control gate electrodes Tc of the nonvolatile memory elements PM1 and PM2 to 0V like a circuit ground voltage, setting the first source electrodes Ts1 of the nonvolatile memory elements to 6V and pulling out electrons from the floating gate electrodes Tf to the first source electrodes Ts1 by tunnel currents. The write states can be achieved by, for example, setting the first drain electrodes Td1 and control gate electrodes Tc of the nonvolatile memory elements PM1 and PM2 to 5V, setting the first source electrodes Ts1 of the nonvolatile memory elements to 0V like the circuit ground voltage, and injecting hot electrons generated at the first drain electrodes Td1 into the floating gates Tf.

Since the floating gate electrodes Tf of the nonvolatile memory elements PM1 and PM2 serve as the gate electrodes of the read MOS transistors DM1 and DM2, the read MOS transistors DM1 and DM2 respectively take or assume switch states or mutual conductances corresponding to electron-injected states/electron-emitted states of the floating gate electrodes Tf, in other words, write states/erase states. Thus, even if a select level is not applied to the control gates Tc, a current corresponding to the switch states or the mutual conductance states can be passed or fed through the read data line RDL through the switch SM. Since no select level is applied to the control gate electrodes Tc, depletion type MOS transistors may be adopted for the read MOS transistors DM1 and DM2 in terms of ensuring of the necessary amount of read signal.

On the other hand, when enhancement type MOS transistors are adopted for the read MOS transistors DM1 and DM2, the select level may preferably be supplied to each control gate electrode Tc even upon a read operation in terms of ensuring of the necessary amount of read signal.

From the above, there is no need to cause a channel current to flow through each of the nonvolatile memory elements PM1 and PM2 according to the threshold voltage upon the read operation. Upon the read operation, the source electrodes Ts1 and drain electrodes Td1 of the nonvolatile memory elements PM1 and PM2 may be respectively set to the circuit ground potential like 0V. Thus, the injection of weak hot electrons from the first drain electrodes Td1 to the floating gates Tf does not occur. When the control gate electrodes Tc are also set to the circuit ground potential at this time, no tunnel current occurs either. Even if the select level is applied to each control gate electrode Tc, no tunnel current occurs between the first drain electrode Td1 and the floating gate electrode Tf. While a weak tunnel or the like might occur between the second drain electrodes Td2 of the read MOS transistors DM1 and DM2, it is considered to present no problem if the select level of each control gate electrode Tc is low. Thus, a problem associated with the inversion of data due to charge gain does not occur upon the read operation. Consequently, the performance of retaining data over a long period is enhanced and hence a reduction in read defective rate or fraction can be realized.

In the example shown in FIG. 16 in particular, one read MOS transistor DM1 shares the use of the floating gate electrode Tf of one nonvolatile memory element PM1, whereas the other read MOS transistor DM2 shares the use of the floating gate electrode Tf of the other nonvolatile memory element DM2. The pair of read MOS transistors DM1 and DM2 is series-connected to the selection transistor element SM. In such a configuration, the pair of nonvolatile memory elements PM1 and PM2 is both programmed into a write state or an erase state. In the write states of both the nonvolatile memory elements PM1 and PM2, both the read MOS transistors DM1 and DM2 are respectively held in an off state. While the possibility that electrical charges held in the nonvolatile memory elements PM1 and PM2 each kept in the write state will leak therefrom due to some reasons, is not 0 at random, a serial path of the read MOS transistors DM1 and DM2 remains in a cutoff state even if the electrical charge held in one nonvolatile memory element PM1 or PM2 leaks therefrom. The probability that the electrical charges retained in both the nonvolatile memory elements PM1 and PM2 will leak therefrom, is extremely low. Consequently, data retention is improved and hence a read defective rate or fraction can be further reduced.

Figure 17:
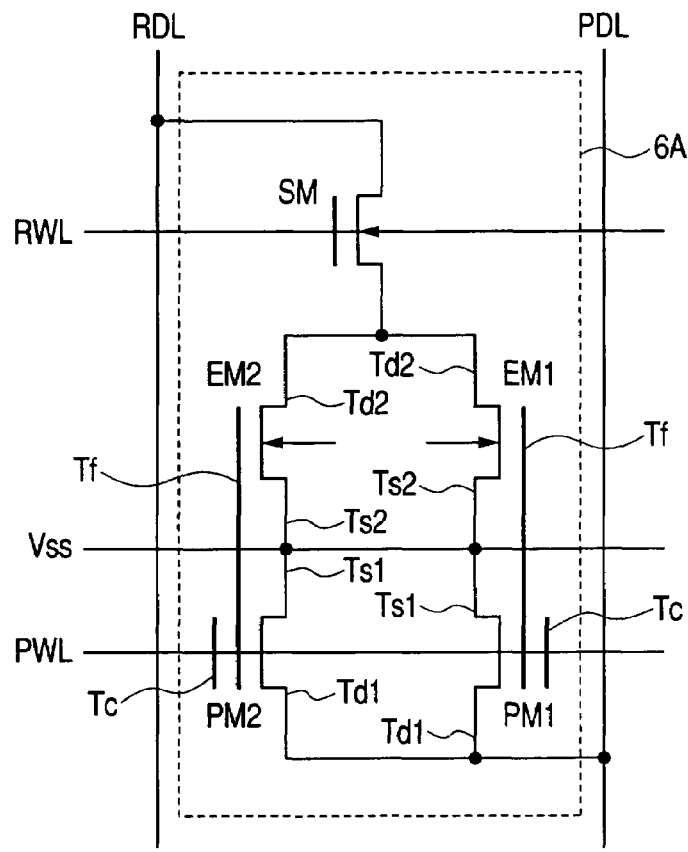
FIG. 17 is a circuit diagram showing another example of the nonvolatile memory cell.

Another example of the nonvolatile memory cell is shown in FIG. 17. The memory cell 6A shown in the same drawing has the nonvolatile memory elements PM1 and PM2 and p channel read MOS transistors EM1 and EM2 respectively provided in pairs. One read MOS transistor EM1 shares a floating gate electrode Tf of one nonvolatile memory element PM1, whereas the other read MOS transistor EM2 shares a floating gate electrode Tf of the other nonvolatile memory element PM2. The pair of read MOS transistors EM1 and EM2 is parallel-connected to the selection MOS transistor SM. In a manner similar to the above even in such a configuration, the pair of nonvolatile memory elements PM1 and PM2 are both programmed into a write state or an erase state. Since the present example is placed on the assumption that the read MOS transistors EM1 and EM2 are different in conductivity type from those shown in FIG. 16, both the read MOS transistors EM1 and EM2 are held in an on state when the nonvolatile memory elements PM1 and PM2 are respectively brought to the write state. While, at this time, the possibility that electrical charges retained in the nonvolatile memory elements PM1 and PM2 each held in the write state will leak therefrom due to some reasons, is not 0 at random, a parallel path of the read MOS transistors EM1 and EM2 remains in an on state even if the retained charge leaks from one of the nonvolatile memory elements PM1 and PM2. The probability that the electrical charges retained in both the nonvolatile memory elements PM1 and PM2 will leak therefrom, is extremely low. Consequently, data retention is improved and hence a read defective rate or fraction can be further reduced.

Figure 18:
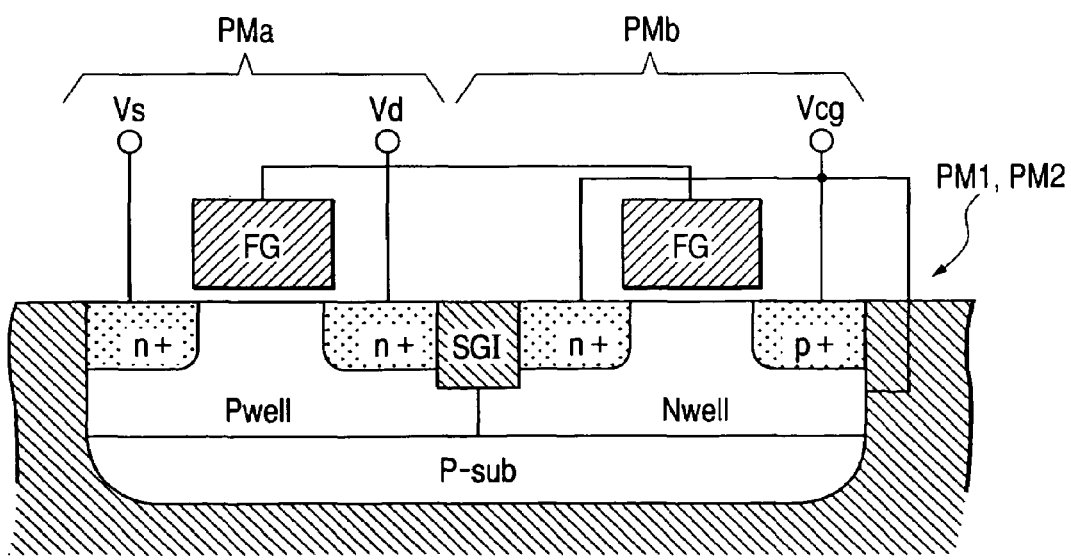
FIG. 18 is a longitudinal sectional view illustrating device-wise structure sections of nonvolatile memory elements.

Device-wise structure sections of the nonvolatile memory elements PM1 and PM2 are illustrated in FIG. 18 by way of example. The nonvolatile memory elements PM1 and PM2 respectively have a MOS capacitive element PMb wherein a capacitance electrode is provided over a first semiconductor region (Nwell) functioning as a control gate electrode with an insulating layer interposed therebetween, and a MOS transistor PMa having a first source electrode, a first drain electrode and a gate electrode formed in a second semiconductor region (Pwell). The capacitance electrode is commonly connected to the gate electrode and is configured so as to function as a floating gate electrode (FG).

The nonvolatile memory elements are formed using a CMOS forming process. Thus, since there is no need to use additional processes other than the CMOS forming process, the manufacturing cost of a semiconductor device including the nonvolatile memory elements can be curbed.

Figure 19:
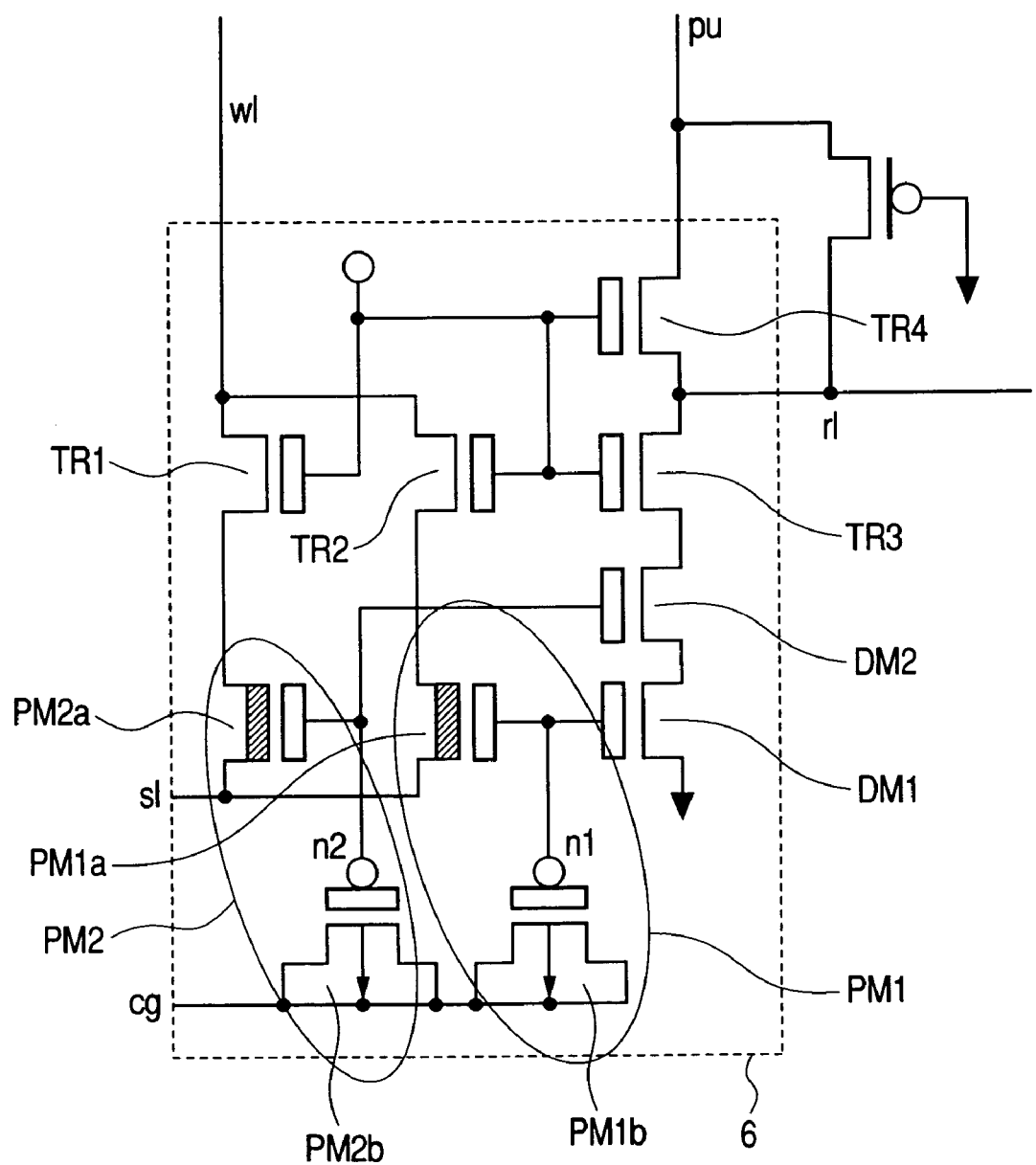
FIG. 19 is a circuit diagram showing a further detailed another example of the nonvolatile memory cell shown in FIG. 16.

A further detailed another example of the nonvolatile memory cell 6 shown in FIG. 16 is shown in FIG. 19. Nonvolatile memory elements PM1 and PM2 respectively have MOS capacitive elements PM1$b$ and PM2$b$ each provided with a capacitance electrode over a first semiconductor region functioning as a control gate electrode with an insulating layer interposed therebetween, and MOS transistors PM1$a$ and PM2$a$ each having a first source electrode, a first drain electrode and a gate electrode formed in a second semiconductor region. In brief, the MOS capacitive elements PM1$b$ and PM2$b$ respectively comprise MOS transistor capacitances whose source electrodes, drain electrodes and back gates are respectively connected in common. The capacitance electrodes of the MOS capacitive elements PM1$b$ and PM2$b$ are respectively commonly connected to the gate electrodes of the MOS transistors PM1$a$ and PM2$a$ and serve as the floating gate electrodes Tf. Read MOS transistors DM1 and DM2 are respectively configured in an enhancement type. Voltage-current characteristics of the MOS transistors DM1 and DM2 with respect to a control gate voltage cg differ according to write and erase states of their corresponding nonvolatile memory elements.

The drain of the read MOS transistor DM2 is coupled to a control node pu through n channel MOS transistors TR3 and TR4. A potential at a connecting node of the transistors TR3 and TR4 is set to an output r1. The MOS transistors PM1$a$ and PM2$a$ are respectively connected to a control node w1 through n channel MOS transistors TR1 and TR2. Gate electrodes of the transistors TR1 through TR4 are biased with a source or power supply voltage cg corresponds to a control gate and s1 corresponds to a source line.

The operation of the nonvolatile memory cell shown in FIG. 19 will be schematically explained. Upon data writing, terminals s1 and cg are supplied with 5V and a terminal w1 is supplied with 0V to thereby turn on the nonvolatile memory elements PM1 and PM2, whereby hot electrons are injected into their floating gates from the terminal s1 side. Upon an erase operation, 5V are applied to the terminal S1 alone to emit electrons from the floating gates by virtue of tunnel emission. Upon a read operation, 1.5V is applied to a terminal pu and 1.5V is applied to the terminal cg to allow a latch circuit of a subsequent stage to latch a potential at a terminal r1, which is determined by switch states or mutual conductance states of the transistors DM1 and DM2, corresponding to stored charges on the floating gates thereof. Upon the read operation, the source electrodes (s1) and drain electrodes (w1) of the nonvolatile memory elements PM1$a$ and PM2$a$ are both fixed to 0V. Thus, no weak hot electrons are injected into the floating gates from the transistors PM1$a$ and PM2$a$ upon reading. Since the transistors TR4, TR3, DM2 and DM1 are vertically piled although the injection of weak hot electrons into the floating gates from the read MOS transistors DM1 and DM2 will take place, drain voltages of the read MOS transistors DM1 and DM2 reach a voltage of pu or less. Further, since a control level of cg at reading is also low, the injection of such hot electrons can be estimated to be substantially as small as negligible. Accordingly, the nonvolatile memory elements PM1 and PM2 can be reduced in their own read defective rates.

While the invention made above by the present inventors has been described specifically based on the illustrated embodiments, the present invention is not-limited to them. It is needless to say that various changes can be made thereto within the scope not departing from the substance thereof.

For instance, the structure of the nonvolatile memory cell is not limited to the configurations described in FIGS. 16 through 19. Further, the data storage format of the nonvolatile memory cell is not limited to the above, and a memory cell having a high-dielectric storage format may be used. In addition, the nonvolatile memory cell is not limited to the OR form or AND form with the nonvolatile memory elements used in pairs. A circuit format may be used in which one nonvolatile memory element and one read MOS transistor are respectively used. A parallel bus may be used in the delivery of control information as an alternative to the serial bus for sequentially connecting the shift registers in series. Further, the register means for receiving the control information are not limited to the shift registers. Registers each having a parallel/in-parallel out format may be used. Forms adapted to a data transfer form may be adopted. The present invention can be widely applied to a semiconductor integrated circuit referred to as a microcomputer, a microprocessor or a data processor including a CPU and a RAM, and to a large-scale semiconductor integrated circuit or the like called a system on-chip LSI or a system LSI.

Advantageous effects obtained by typical ones of the inventions disclosed in the present application will be described in brief as follows:

A semiconductor integrated circuit according to the present invention makes use of nonvolatile memory cells of a fuse circuit connected to a dedicated signal line without using a nonvolatile memory such as a flash memory intended for general purpose use, which is connected to a first wiring like a common bus, in order to store control information for defect relief of each circuit module, trimming of circuit characteristics or function switching of circuit modules. Accordingly, the reliability of storage of the control information is not limited to the performance of storage of information in the nonvolatile memory such as the flash memory intended for general purpose use, and the reliability of storage of the control information can be easily enhanced.

Since a second wiring used in the transfer of the control information is of a wiring dedicated for its transfer, it needs not perform switching between connections to circuit portions used for actual operations in the circuit modules and their control. Consequently, a circuit configuration for delivering the control information can be simplified.

Since a voltage-applied state enabling reading of memory information from each of the nonvolatile memory cells is released after reading of the control information from the fuse circuit, no electrical stress is applied to each nonvolatile memory cell of the fuse circuit even if an actual operating period of the semiconductor integrated circuit exits subsequently to its release. Even in such a viewpoint, the reliability of storage of the control information is enhanced.

By concentratedly placing the fuse circuit in one location of the semiconductor substrate, a high-voltage operated circuit necessary to write memory information may not be provided in a disperse form. Further, a space used to make separation from a low-withstand circuit portion or to be away therefrom can be held to a minimum.

Owing to the adoption of testing external interface means which enables the input/output of the information on the second wiring between the same means and the outside of the semiconductor integrated circuit, the frequency of rewriting each nonvolatile memory cell to execute operation confirmation by the control information can be reduced to the utmost. Consequently, the possibility of deterioration of characteristics of each nonvolatile memory cell can be reduced.

Such a structure that upon a read operation, a channel current may not be passed or fed through each nonvolatile memory element and a large word line voltage may not be applied thereto, is adopted in each of the nonvolatile memory cells to thereby prevent the occurrence of inversion of data due to charge gain or the like.

Since floating gate electrodes of nonvolatile memory elements are respectively used as gate electrodes of read transistor elements, the read transistor elements respectively take or assume switch states or mutual conductances corresponding to electron-injected states/electron-emitted states of the floating gate electrodes, in other words, write states/erase states. Thus, even if a select level is not applied to control gates, a current corresponding to the switch states or the mutual conductance states can be passed or fed through the transmission means.

Owing to the above, there is no need to cause a channel current corresponding to a threshold voltage to flow through each of the nonvolatile memory elements upon the read operation. Upon the read operation, the source electrodes and drain electrodes of the nonvolatile memory elements may be respectively set to a circuit ground potential like 0V. Accordingly, the injection of weak hot electrons from first drain electrodes to floating gates does not occur. Thus, a problem associated with the inversion of data due to charge gain does not occur upon the read operation. Consequently, the performance of retaining data over a long period is enhanced and hence a reduction in read defective rate can be realized.

The nonvolatile memory elements and read transistor elements are respectively provided in pairs. One read transistor element shares the use of the floating gate electrode of one nonvolatile memory element, whereas the other read transistor element shares the use of the floating gate electrode of the other nonvolatile memory element. The pair of read transistor elements is series-connected or parallel-connected to the selection transistor element. In such a configuration, the pair of nonvolatile memory elements is both programmed into a write state or an erase state. In the write states of both the nonvolatile memory elements, both the read transistor elements are respectively held in an off state. While the possibility that electrical charges held in the nonvolatile memory elements each kept in the write state will leak therefrom due to some reasons, is not 0 at random, a serial path of the read transistor elements remains in a cutoff state and a parallel path of the read transistor elements remains in an on state even if the electrical charge held in one nonvolatile memory element leaks therefrom. The probability that the electrical charges retained in both the nonvolatile memory elements will leak therefrom, is extremely low. Consequently, data retention is improved and hence a read defective rate or fraction can be further reduced.

In a method of manufacturing a semiconductor integrated circuit, according to the present invention, the operation of each circuit module is confirmed according to control information supplied from outside, and control data is written into the fuse circuit according to the result of confirmation thereof. Therefore, there is no need to write the control information in each nonvolatile memory cell on a case-by-case basis when the operation is confirmed based on the control information. Thus, it is not necessary to rewrite each nonvolatile memory cell for the purpose of the operation confirmation. Consequently, deterioration of characteristics of each nonvolatile memory cell can be reduced.

What is claimed is:

1. A method of manufacturing a semiconductor integrated circuit including:

a plurality of circuit modules;

a fuse circuit which has a plurality of nonvolatile memory cells capable of writing therein control information for defect relief, trimming of circuit characteristics or function switching with respect to the plurality of circuit modules and which allows memory information to be electrically read therefrom;

a dedicated wiring which allows the memory information of the fuse circuit to be transmitted to the circuit modules; and testing external interface means which makes it possible to output information on the dedicated wiring to the outside of a semiconductor substrate and to externally input data to the dedicated wiring, said method comprising:

a first process for supplying control information from the testing external interface means to each of the circuit modules through the dedicated wiring;

a second process for confirming an operation of each of the circuit modules in a supplied state of the control information; and a third process for writing control data in the fuse circuit according to the result of confirmation by the second process.

2. A method of manufacturing a semiconductor integrated circuit according to claim 1, wherein the fuse circuit is concentratedly placed in one location of the semiconductor substrate.

3. A method of manufacturing a semiconductor integrated circuit according to claim 1, wherein the operation of the control circuit is started in response to an instruction for initializing the semiconductor integrated circuit.

4. A method of manufacturing a semiconductor integrated circuit according to claim 1, wherein the first register circuit and the plurality of second register circuits are connected in series by the second wiring.

5. A method of manufacturing a semiconductor integrated circuit according to claim 4, wherein the first register circuit is a shift register which holds control information parallel-outputted from the fuse circuit and outputs the same on a serial basis.

6. A method of manufacturing a semiconductor integrated circuit according to claim 5, wherein the second register circuits are shift registers which have serial input terminals connected upstream of the second wiring, serial output terminals connected downstream of the second wiring, and parallel output terminals connected to their corresponding circuit modules.

7. A method of manufacturing a semiconductor integrated circuit according to claim 1, further including testing external interface means which makes it possible to output information on the second wiring to the outside of the semiconductor substrate and to input data from outside to the second wiring.

8. A method of manufacturing a semiconductor integrated circuit according to claim 1, wherein the fuse circuit has a nonvolatile memory cell assigned for storage of a sign bit indicative of whether writing of control information into each of the nonvolatile memory cells is done.

9. A method of manufacturing a semiconductor integrated circuit according to claim 1, wherein the control information stored in the fuse circuit is any one of information for substituting a defective circuit module with a spare circuit module and control information for relieving a partial defect in each circuit module, or both information.

10. A method of manufacturing a semiconductor integrated circuit according to claim 1, wherein each of the nonvolatile memory cells includes:

nonvolatile memory elements having first source electrodes, first drain electrodes, floating gate electrodes and control gate electrodes and capable of having different threshold voltages;

read transistor elements having second source electrodes and second drain electrodes, having the floating gate electrodes as gate electrodes and capable of having mutual conductances different according to threshold voltages held by the nonvolatile memory elements; and a selection transistor which connects the read transistor elements to a read signal line.

11. A method of manufacturing a semiconductor integrated circuit according to claim 1, wherein each of the nonvolatile memory cells includes:

nonvolatile memory elements having first source electrodes, first drain electrodes, floating gate electrodes and control gate electrodes and capable of having different threshold voltages;

read transistor elements having second source electrodes and second drain electrodes, having the floating gate electrodes as gate electrodes and capable of having switch states different according to threshold voltages held by the nonvolatile memory elements; and a selection transistor which connects the read transistor elements to a read signal line.

12. A method of manufacturing a semiconductor integrated circuit according to claim 10, wherein each of the nonvolatile memory elements has a MOS capacitive element in which a capacitance electrode is provided over a first semiconductor region functioning as a control gate electrode with an insulating layer interposed there between, and a MOS transistor having a first source electrode, a first drain electrode and a gate electrode formed in a second semiconductor region, and the capacitance electrode is commonly connected to the gate electrode and functions as a floating gate electrode.

13. A method of manufacturing a semiconductor integrated circuit according to claim 10, wherein the nonvolatile memory elements and read transistor elements are respectively provided in pairs, and one read transistor element shares a floating gate electrode of one nonvolatile memory element, whereas the other read transistor element shares a floating gate electrode of the other nonvolatile memory element, and the pair of read transistor elements is series-connected to the selection transistor element.

14. A method of manufacturing a semiconductor integrated circuit according to claim 10, wherein the nonvolatile memory elements and read transistor elements are respectively provided in pairs, and one read transistor element shares a floating gate electrode of one nonvolatile memory element, whereas the other read transistor element shares a floating gate electrode of the other nonvolatile memory element, and the pair of read transistor elements is parallel-connected to the selection transistor element.

15. A method of manufacturing a semiconductor integrated circuit according to claim 11, wherein each of the nonvolatile memory elements has a MOS capacitive element in which a capacitance electrode is provided over a first semiconductor region functioning as a control gate electrode with an insulating layer interposed there between, and a MOS transistor having a first source electrode, a first drain electrode and a gate electrode formed in a second semiconductor region, and the capacitance electrode is commonly connected to the gate electrode and functions as a floating gate electrode.

16. A method of manufacturing a semiconductor integrated circuit according to claim 11, wherein the nonvolatile memory elements and read transistor elements are respectively provided in pairs, and one read transistor element shares a floating gate electrode of one nonvolatile memory element, whereas the other read transistor element shares a floating gate electrode of the other nonvolatile memory element, and the pair of read transistor elements is series-connected to the selection transistor element.

17. A method of manufacturing a semiconductor integrated circuit according to claim 11, wherein the nonvolatile memory elements and read transistor elements are respectively provided in pairs, and one read transistor element shares a floating gate electrode of one nonvolatile memory element, whereas the other read transistor element shares a floating gate electrode of the other nonvolatile memory element, and the pair of read transistor elements is parallel-connected to the selection transistor element.

* * * * *